United States Patent
Kostick et al.

(10) Patent No.: US 9,098,652 B2
(45) Date of Patent: Aug. 4, 2015

(54) PARTITIONING AND PARALLEL PROCESSING OF A VIRTUAL PROTOTYPE SIMULATION OF A HARDWARE DESIGN

(71) Applicant: Carbon Design Systems Inc., Acton, MA (US)

(72) Inventors: Mark Kostick, Jamaica Plain, MA (US); David C. Scott, Concord, MA (US); William E. Neifert, Lexington, MA (US); Joseph Tatham, Carlisle, MA (US); Matt Grasse, Wellesley, MA (US)

(73) Assignee: CARBON DESIGN SYSTEMS, INC., Acton, MA (US)

( * ) Notice: Subject to any disclaimer, the term of this patent is extended or adjusted under 35 U.S.C. 154(b) by 289 days.

(21) Appl. No.: 13/804,517

(22) Filed: Mar. 14, 2013

(65) Prior Publication Data
US 2014/0107995 A1    Apr. 17, 2014

Related U.S. Application Data

(60) Provisional application No. 61/713,364, filed on Oct. 12, 2012.

(51) Int. Cl.
 *G06F 9/455* (2006.01)
 *G06F 17/50* (2006.01)
(52) U.S. Cl.
 CPC ............ *G06F 17/5009* (2013.01); *G06F 9/455* (2013.01); *G06F 17/5027* (2013.01)
(58) Field of Classification Search
 USPC ............................................ 703/24, 26, 27
 See application file for complete search history.

(56) References Cited

U.S. PATENT DOCUMENTS

| | | | | |
|---|---|---|---|---|
| 7,613,599 | B2* | 11/2009 | Bade et al. | 703/14 |
| 7,739,360 | B2* | 6/2010 | Watson et al. | 709/220 |
| 7,970,596 | B2* | 6/2011 | Bade et al. | 703/13 |
| 8,666,723 | B2* | 3/2014 | Xie et al. | 703/14 |
| 2002/0059054 | A1* | 5/2002 | Bade et al. | 703/20 |
| 2005/0022143 | A1* | 1/2005 | Butts et al. | 716/5 |
| 2010/0017185 | A1* | 1/2010 | Bade et al. | 703/13 |
| 2014/0304685 | A1* | 10/2014 | Xie et al. | 717/124 |

* cited by examiner

*Primary Examiner* — Thai Phan
(74) *Attorney, Agent, or Firm* — Oblon, McClelland, Maier & Neustadt, L.L.P.

(57) ABSTRACT

A method including accessing a first virtual prototype configured to perform a first simulation of a hardware design, identifying checkpoints within the first virtual prototype, each checkpoint including a storage state and/or behavioral state, and determining breakpoints for dividing execution of a second virtual prototype into a series of execution segments, where the second virtual prototype is configured to perform a second simulation of the hardware design, the second virtual prototype includes virtual models representing a separate portion of the hardware design, each virtual model representing a same portion of the hardware design as a corresponding virtual model of the first virtual prototype. The method may include mapping the storage state and/or behavioral state of each checkpoint to a respective execution segment, executing the second simulation while collecting respective data regarding execution of each execution segment, where two or more execution segments are executed concurrently, and aggregating the respective data.

30 Claims, 10 Drawing Sheets

PARTITIONING AND PARALLEL PROCESSING OF A VIRTUAL PROTOTYPE SIMULATION OF A HARDWARE DESIGN

RELATED APPLICATIONS

The present application is related to and claims priority from U.S. Provisional Application No. 61/713,364 entitled "Partitioning and Parallel Processing of a Virtual Prototype Simulation of a Hardware Design" and filed Oct. 12, 2012, the contents of which are hereby incorporated by reference in its entirety.

BACKGROUND

A standard part of the design process for leading edge system on chip (SoC) designs is to create a prototype of the design before it is fabricated to silicon. This prototype can take several forms depending upon the design problem being addressed. It is not unusual for multiple prototypes to be created of the same design in order to best address specific design issues. There are two primary types of prototypes: physical prototypes and virtual prototypes.

Physical prototypes are typically either hardware emulators or Field Programmable Gate Array (FPGA) prototypes. Hardware emulators, such as the Cadence® Palladium® verification computing platform from Cadence of San Jose, Calif., the Veloce verification system from Mentor Graphics of Wilsonville, Oreg., or the EVE ZeBu-Server system emulator from Synopsys, Inc. of Mountain View, Calif., for example, model the behavior of the SoC design using a collection of custom processors or FPGAs. To develop a physical prototype, the hardware design for the SoC is compiled from its hardware design language (HDL) into a custom representation which is then downloaded into the physical prototype for execution.

Virtual prototypes form a software-only representation of a system on chip design. Depending upon the accuracy of the virtual prototype, it can execute at a full range of speeds. The virtual prototype can execute much faster than the actual hardware which it represents or much more slowly in cases where the virtual prototype is more accurately representing the behavior of the underlying hardware. The virtual prototype typically contains a collection of virtual prototype models, each virtual prototype model representing the various hardware components in the SoC design being modeled.

Whereas a hardware prototype necessarily represents all of the functionality of the modeled components, this is not necessarily true for virtual prototypes. It is common practice to abstract the timing details of a virtual prototype model in order to achieve faster execution speed. In some cases, the functionality of a virtual prototype model may also be abstracted to achieve faster performance or shorten model development time. Each component may be modeled at a different level of timing or functional accuracy depending upon the needs of the designer.

Depending upon the abstraction level of the individual models, virtual prototypes may be used at various points during the SoC design cycle. Accurate virtual prototypes can be used to perform architectural analysis, semiconductor intellectual property (IP) core selection and firmware development. A virtual prototype which does not have timing accuracy would likely not be used in this case due to lacking sufficient design detail. Higher speed, more abstract virtual prototypes can boot an operating system and execute application code, all before actual silicon is fabricated. While accurate virtual prototypes may be used for these tasks as well, it is rarely done due to the much slower execution times.

The accuracy of a virtual prototype type depends upon the accuracy of the virtual prototype models it contains. Indeed, there can be multiple virtual prototype models at different levels of abstraction contained in the same virtual prototype. Accuracy in this case does not typically refer to the functional accuracy of the prototype but more to the timing of the system. Most virtual prototypes will represent all of the functionality of the modeled component but with varying levels of timing accuracy. Most virtual prototypes are written based upon the transaction-level modeling (TLM) standard, produced by the Accellera Systems Initiative of Napa, Calif. and incorporated into the Institute of Electrical and Electronics Engineers Standards Association (IEEE-SA) 1666 standard for SystemC™. The TLM specification describes coding guidelines for a loosely-timed (LT) and approximately-timed (AT) level of abstraction. In a loosely timed virtual prototype, the models contained in the virtual prototype will either be completely untimed or will correlate their timing to actual execution time only at transaction boundaries. In an approximately timed virtual prototype, the virtual prototype model typically correlates to the system time at the boundary of every transaction and will often include additional timing information for actions which occur in the middle of a transaction. Commercially available loosely timed models include the Fast Models for ARM® (ARM Holdings of Cambridge, UK) and the Open Virtual Platforms™ (OVP™ of Oxfordshire, UK) designed by Imperas™ Software of Oxfordshire, UK.

Additionally, there are cycle accurate (CA) virtual prototypes which completely model the behavior of the underlying hardware. These models can either be hand-written to model this behavior and then validated against the actual design, or created automatically from the HDL representation of the component. For example, some commercially available cycle accurate virtual prototype models are created directly from HDL using the Carbon Model Studio product from Carbon Design Systems of Acton, Mass.

LT models execute quickly but do not contain sufficient timing detail to enable their use to make hardware design decisions. CA models are accurate enough to be used to make hardware design decisions but execute too slowly to be useful for software development. There is a need for a solution which provides adequate speed for aiding in software development, while providing accurate analysis for validating the behavior of the underlying hardware.

SUMMARY

In some implementations, the disclosure contains descriptions of various methods and systems for accelerating the execution of a virtual prototype simulation. Acceleration may be achieved, for example, by creating a series of simulation execution segments from the virtual prototype simulation, creating a checkpoint from the virtual prototype simulation for each execution segment to represent the checkpoint data for each segment, identifying the conditions necessary to indicate the end of each execution segment, restoring checkpoint data associated with the checkpoints mapped to the virtual prototype simulation, executing the execution segments in parallel until the previously identified exit conditions for each execution segment are met, and subsequently reassembling data obtained through the execution of the execution segments to achieve substantially the same results as if the execution of the virtual prototype simulation had taken place linearly in a single virtual prototype execution. In some implementations, each execution segment of the target virtual prototype simulation is identified such that all execution segments share substantially the same length of execution time (e.g., within a threshold portion of total execution time). Thus, partitioning a target virtual prototype simulation into five execution segments can result in completion of the execution nearly five times faster than linear execution of the target virtual prototype simulation.

In one aspect, the present disclosure relates to a method including accessing a first virtual prototype including one or more virtual models, where the first virtual prototype is configured, upon execution, to perform a first simulation of at least a portion of a hardware design, and identifying, by a processor of a computing device, a number of checkpoints within the first virtual prototype, where each checkpoint of the number of checkpoints includes at least one of a storage state and a behavioral state. The method may include determining, by the processor, a number of breakpoints for dividing execution of a second virtual prototype into a series of autonomous execution segments, where the second virtual prototype is configured, upon execution, to perform a second simulation of the portion of the hardware design, the second virtual prototype includes one or more virtual models, where each virtual model of the second virtual prototype represents a separate portion of the hardware design, and each respective virtual model of the second virtual prototype represents a same portion of the hardware design as a corresponding virtual model of the first virtual prototype, and the number of breakpoints correspond to the number of checkpoints. The method may include, for each checkpoint of the number of checkpoints, mapping, by the processor, the at least one of the storage state and the behavioral state of the respective checkpoint to a respective execution segment including a respective breakpoint of the number of breakpoints. The method may include causing, by the processor, execution of the second simulation, where executing the second simulation includes executing each execution segment of the series of autonomous execution segments, where two or more execution segments of the series of autonomous execution segments are executed concurrently, and respective data is collected during execution of each execution segment of the series of autonomous execution segments. The method may include aggregating, by the processor, the respective data as aggregated data.

In some embodiments, identifying the number of checkpoints includes estimating execution time of each execution segment of the series of execution segments within a threshold variance. The hardware design may include an integrated embedded system design. The hardware design may include a system on a chip (SoC) design. The second virtual prototype may be a real time simulation. The first virtual prototype may be a loosely-timed prototype or an approximately-timed prototype. The second virtual prototype may be a cycle accurate prototype. Each checkpoint of the number of checkpoints may be represented in at least one of a simulated timeframe and an event-driven timeframe.

In some embodiments, the method includes generating report data based in part upon the aggregated data. The report data may be based upon data collected through execution of the first simulation. Identifying the number of checkpoints may include executing the first simulation, and the data collected through execution of the first simulation may include the at least one of the storage state and the behavioral state. The method may include validating at least one of the first virtual prototype and the second virtual prototype, where validating includes analyzing the aggregated data in light of the data collected through execution of the first simulation.

The first virtual prototype may include two or more software processes, and identifying the number of checkpoints may include identifying the number of checkpoints within a subset of the two or more software processes. The method may include, prior to executing each execution segment of the series of autonomous execution segments, importing initialization data into each execution segment of the series of execution segments.

In some embodiments, identifying the number of checkpoints includes recognizing one or more exclusion zones within a code base of the first virtual prototype, and marking the one or more exclusion zones as ineligible for checkpoint identification. Each exclusion zone of the one or more exclusion zones may include a software routine that executes at one of a) varying frequency and b) varying length of time depending upon a level of abstraction of simulation prototype. A first exclusion zone of the one or more exclusion zones may include an interrupt service routine.

In some embodiments, the method includes, prior to identifying the number of checkpoints, executing the first simulation to determine a total length of simulation. Identifying the number of checkpoints may include executing the first simulation while tracking at least one of a program counter and a series of program branches. The method may include, while executing the first simulation, creating a program execution flow log of the first simulation. Executing the series of autonomous execution segments may include, for each execution segment of the series of autonomous execution segments, tracking a program execution flow, and comparing the program execution flow to a portion of the program execution flow log of the first simulation, where the portion of the program execution flow log maps to the respective execution segment. Tracking the program execution flow may include tracking the program execution flow using the program counter. Tracking the program execution flow may include tracking the program branches. The method may include, while comparing the program execution flow to the portion of the program execution flow log of the first simulation, identifying a deviation between the program execution flow and the portion of the program execution flow log.

In one aspect, the present disclosure relates to a system including a processor, and a memory having instructions stored thereon, where the instructions, when executed by the processor, cause the processor to access a first virtual prototype including one or more virtual models, where the first virtual prototype is configured, upon execution, to perform a first simulation of at least a portion of a hardware design. The instructions when executed may cause the processor to identify a number of checkpoints within the first virtual prototype, where each checkpoint of the number of checkpoints includes at least one of a storage state and a behavioral state, and determine a number of breakpoints for dividing execution of a second virtual prototype into a series of autonomous execution segments, where the second virtual prototype is configured, upon execution, to perform a second simulation of the portion of the hardware design, the second virtual prototype includes one or more virtual models, where each virtual model of the second virtual prototype represents a separate portion of the hardware design, and each respective virtual model of the second virtual prototype represents a same portion of the hardware design as a corresponding virtual model of the first virtual prototype, and the number of breakpoints correspond to the number of checkpoints. The instructions when executed may cause the processor to, for each checkpoint of the number of checkpoints, map the at least one of the storage state and the behavioral state of the respective checkpoint to a respective execution segment including a respective breakpoint of the number of breakpoints. The instructions when executed may cause the processor to cause execution of the second simulation, where executing the second simulation includes executing each execution segment of the series of autonomous execution segments, where two or more execution segments of the series of autonomous execution segments are executed concurrently, and respective data is collected during execution of each execution segment of the series of autonomous execution segments. The instructions when executed may cause the processor to aggregate the respective data as aggregated data.

In some embodiments, the instructions when executed may cause the processor to, for each execution segment of the series of autonomous execution segments, determine one or more end conditions. The one or more end conditions may include one of a timed event and an untimed event within the execution of the second simulation.

In some embodiments, identifying the number of checkpoints includes building a warm-up period into each execution segment of the series of autonomous execution segments following a first execution segment of the series of autonomous execution segments, where building the warm-up period into a given execution segment includes determining the one or more end conditions to identify a point in execution after a respective breakpoint representing a begin point of a next execution segment. Aggregating the respective data may include discarding a portion of the respective data corresponding to a respective warm-up period.

In one aspect, the present disclosure relates to a non-transitory computer readable medium having instructions stored thereon, where the instructions, when executed by a processor, cause the processor to access a first virtual prototype including one or more virtual models, where the first virtual prototype is configured, upon execution, to perform a first simulation of at least a portion of a hardware design. The instructions when executed may cause the processor to identify a number of checkpoints within the first virtual prototype, where each checkpoint of the number of checkpoints includes at least one of a storage state and a behavioral state. The instructions when executed may cause the processor to determine a number of breakpoints for dividing execution of a second virtual prototype into a series of autonomous execution segments, where the second virtual prototype is configured, upon execution, to perform a second simulation of the portion of the hardware design, the second virtual prototype includes one or more virtual models, where each virtual model of the second virtual prototype represents a separate portion of the hardware design, and each respective virtual model of the second virtual prototype represents a same portion of the hardware design as a corresponding virtual model of the first virtual prototype, and the number of breakpoints correspond to the number of checkpoints. The instructions when executed may cause the processor to, for each checkpoint of the number of checkpoints, map the at least one of the storage state and the behavioral state of the respective checkpoint to a respective execution segment including a respective breakpoint of the number of breakpoints. The instructions when executed may cause the processor to cause execution of the second simulation, where executing the second simulation includes executing each execution segment of the series of autonomous execution segments, where two or more execution segments of the series of autonomous execution segments are executed concurrently, and respective data is collected during execution of each execution segment of the series of autonomous execution segments. The instructions when executed may cause the processor to aggregate the respective data as aggregated data.

BRIEF DESCRIPTION OF THE FIGURES

The foregoing and other objects, aspects, features, and advantages of the present disclosure will become more apparent and better understood by referring to the following description taken in conjunction with the accompanying drawings, in which.

Figure 1:
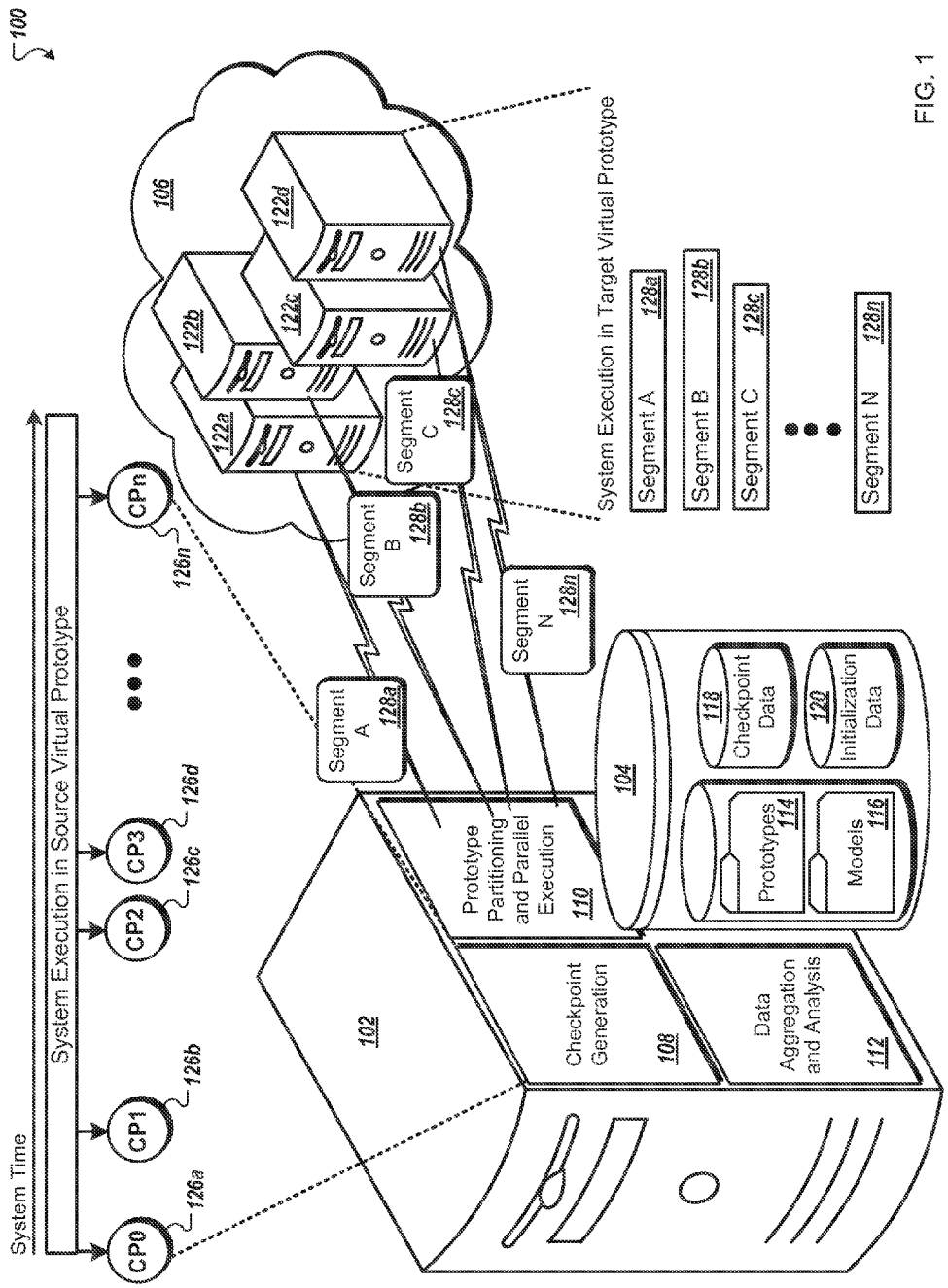
FIG. 1 is a block diagram of an example system for partitioning and parallel processing of a virtual prototype simulation of a hardware design.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

FIG. 1 is a block diagram of an example system 100 for partitioning and parallel processing of a virtual prototype simulation of a hardware design based upon a series of checkpoints derived from the virtual prototype simulation. The system 100, in some implementations, includes a computing device 102 for manipulating a particular (e.g., "target") virtual prototype 114 of a hardware design. The hardware design, in some examples, may include an integrated embedded system design, a system on a chip (SoC) design, or any collection of one or more hardware devices comprising a hardware system or subsystem. Each of the virtual prototypes 114 may be developed as a software model for representing and testing a particular hardware design (e.g., prior to creating a physical model of the hardware design). The virtual prototypes 114, in some implementations, are each composed of a number of virtual models 116, each virtual model 116 representing a different facet of the hardware design. For example, separate models may be built to represent a processor core or central processing unit (CPU), a graphics controller, a memory controller and memory, a bus coordinator, and an I/O controller of a particular hardware design. The software executed by the virtual prototype 144 (such as an operating system or firmware) is typically stored in one or more of the virtual models 116, for example within a memory portion. Therefore, when system checkpoints are created, the execution state of the software is captured as well. Each virtual model 116 and/or virtual prototype 114, furthermore, may be created at varying levels of abstraction (e.g., level of timing accuracy in portraying the hardware design). For example, a first virtual model 116 and/or virtual prototype 114 may be designed to execute much faster than the hardware design (e.g., to swiftly execute the functionality of the hardware design), while a second virtual model 116 and/or virtual prototype 114 may be designed to accurately represent the functionality and timing behavior of the underlying hardware. In some implementations, only a portion of the virtual models 116 may be included when executing a particular virtual prototype 114. For example, depending upon the interests of the particular test, more or fewer aspects of the hardware design functionality may be included within the virtual prototype 114.

In some implementations, prior to executing a target (e.g., more complex and/or more accurate) virtual prototype 114, a source virtual prototype 114 may be used to identify a series of checkpoints 126 for partitioning software execution of the target virtual prototype 114 into a series of execution segments 128. The series of execution segments 128 may then be executed in parallel to speed the testing and analysis of the target virtual prototype 114. The source virtual prototype 114, for example, includes one or more virtual models 116 modeling the same design blocks as corresponding virtual models 116 of the target virtual prototype 114. In some implementations, the source virtual prototype 114 and the target virtual prototype 114 contain a matching number and type of virtual models 116. In some implementations, the source virtual prototype 114 and the target virtual prototype 114 contain a matching virtual model 116 (e.g., containing the same software modules for representing the particular facet of the hardware design).

In some implementations, the checkpoints 126 represent a snapshot of the source virtual prototype 114 at a breakpoint (e.g., a software, hardware, and/or timing condition) within a flow of operations (e.g., source code flow, instruction flow, program counter, etc.). In some examples, a breakpoint may correspond to one or more software events (e.g., a program counter reaching a set value for a set number of times, a branch being taken, a software register achieving a defined value, etc.), system events (e.g., an interface between models reaching a set value) and/or model events (e.g., a modeled register or signal achieving a defined value). The snapshot includes information regarding the state of each virtual model within the source virtual prototype at the point of the breakpoint. Depending in part upon the abstraction level of each virtual model, a particular checkpoint 126 may contain one or more register states, one or more memory states, one or more cache states, and/or values pertaining to other storage elements used by at least one of the virtual models of the source virtual prototype. In some implementations, a particular checkpoint 126 can contain values that do not correspond to a physical component of the hardware being modeled (e.g., existing only for modeling purposes). The snapshots, in some implementations, contain a binary state of one or more virtual models 116 of the source virtual prototype 114. A binary state, for example, includes a memory image of the execution state including modeling artifacts such as, for example, a cache state, a state of one or more prediction elements, and/or a state associated with one or more state-dependent execution optimizations. The binary state may only be applied when mapping to a target virtual prototype 114 having an identical virtual model 116 as the virtual model 116 of the source virtual prototype 114 in which the checkpoint was generated.

The snapshots, in some implementations, are stored by the checkpoint generation module 108 as checkpoint data 118.

In some implementations, a particular execution segment 128 may require further information to enable autonomous execution. For example, if a checkpoint 126 is created in a source virtual prototype containing one or more virtual models at a higher level of abstraction than a level of abstraction of the corresponding virtual model(s) of the target virtual prototype simulation, initialization data 120 may be included to initialize values, such as memory content and/or register values, that were not represented (or not accessible via an application programming interface (API)) within the source virtual prototype simulation. The prototype partitioning and parallel execution module 110, in some implementations, may map initialization data 120 to the target virtual prototype 114 to aid in the setup of the execution segments 128 for autonomous execution. The initialization data 120, in some examples, may include default values (e.g., obtained through system manuals or materials known about the target virtual prototype 114) and/or customized information (e.g., provided by a user executing the prototype partitioning and parallel execution module 110).

The checkpoints 126, in some implementations, represent the state of the target virtual prototype at the beginning of each execution segment. Also included in the setup of each execution segment 128 is information regarding an endpoint (e.g., an end of execution for a particular execution segment corresponding to a particular checkpoint 126). The endpoint of a particular execution segment 126, in some implementations, corresponds to an untimed event (e.g., within an untimed source virtual prototype simulation), such as, in some examples, a set of branches describing a program flow, a program counter value, or a detected pattern (or repetition of patterns) of a program flow. In some implementations, the endpoint of a particular execution segment 126 corresponds to a timed event (e.g., within a cycle accurate virtual prototype simulation), such as, in some examples, a number of seconds or a number of cycles into the execution of the source virtual prototype simulation. In some implementations, the endpoint of a particular execution segment is defined by an external event such as an interrupt or system timer expiration. In some implementations, each checkpoint 126 corresponds to a point within a program execution flow log tracing a flow of operations within the source virtual prototype simulation. For example, during execution of the source virtual prototype simulation, a checkpoint generation module 108 may create a program execution flow log identifying events, data, and states corresponding to stages of the execution flow. The endpoint of a particular execution segment 126, for example, may be identified by an event or series of events captured within the program execution flow log. The program execution flow log, for example, may be stored by the checkpoint generation module 108 as checkpoint data 118.

Upon partitioning and data initialization of the target virtual prototype 114, in some implementations, the prototype partitioning and parallel execution module 110 schedules the execution segments 128 for parallel execution upon a number of processors 122. In some implementations, the processors are contained within two or more computing devices (e.g., servers, etc.) accessible to the computing device 102 via a network, such as the network 106. In other implementations, the execution segments 128 are executed upon a single multi-processor computing device. If there are fewer processing systems available than execution segments 128, in some implementations, the prototype partitioning and parallel execution module 110 schedules a first set of execution segments 128 for execution, followed by one or more subsequent sets of execution segments 128, until all of the execution segments 128 have been executed. The number of execution segments 128, in some implementations, is selected based upon a number of available processors for parallel execution.

While executing, representative data is collected for each of the execution segments 128. The data, in some implementations, is fed to a data aggregation and analysis module 112. The data aggregation and analysis module, for example, appends the collected data together for analysis of the functionality of the target virtual prototype simulation. In some implementations, the data aggregation and analysis module discards a portion of the data collected by one or more of the execution segments 128. For example, due to difficulties in establishing discrete start and stop times via the checkpoints 126, there may be overlap in functionality of one or more pairs of the execution segments 128. In another example, subsequent execution segments (e.g., execution segment 128b through 128n) may each be allotted a "warm-up period" to allow the particular execution segment 128 to fully initialize. For example, the hardware design may incorporate one or more prediction elements and/or other execution optimizations that may affect the behavior of the execution time and execution path (e.g., branch flow, etc.) of one or more virtual models 116 within the target virtual prototype 114. In another example, a memory cache which may not be implemented in one or more virtual models 116 in a source virtual prototype 114 but is implemented in the corresponding virtual models 114 in the target virtual prototypes may alter the behavior of the execution time and/or execution path. In some implementations, the checkpoint generation module 108 is configured to create an overlap when establishing the checkpoints 126 to allow for a warm-up period.

Upon aggregation and analysis of the data, in some implementations, the data aggregation and analysis module 112 may generate report data for user analysis. In some implementations, the report data may include information regarding one or more deviations between the functionality of the source virtual prototype 114 and the target virtual prototype 114. For example, should the virtual models 116 differ dramatically between the functionality within the source virtual prototype 114 and the target virtual prototype 114, this may suggest that one of the virtual prototypes 114 contains an error in either the virtual models 116 or the software running on these models.

While described in relation to modules 108, 110, and 112 of the computing device 102, in some implementations, the methods and processes involved in checkpoint generation, partitioning, execution, and analysis of the virtual prototypes 114 may be performed on one or more systems and/or by one or more programs. Additionally, one or more of the functionalities may be performed at different times. For example, previously stored checkpoint data 118 may be mapped to one or more target virtual prototypes 114 at a later time, and aggregated data collected via the execution of the execution segments 128 may be provided to a separate software module and/or computing system for analysis and generation of report data. Other functionalities and methods are described below.

Figure 2:
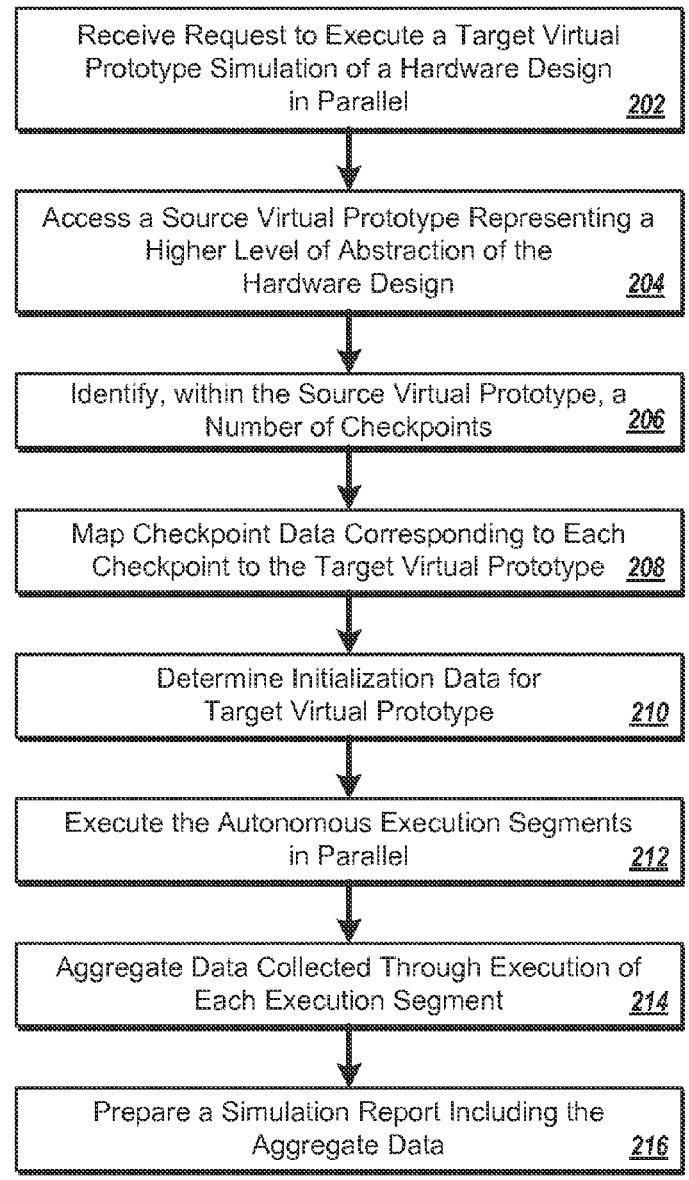
FIG. 2 is a flow chart of an example method for partitioning and parallel processing of a virtual prototype simulation of a hardware design.

Turning to FIG. 2, a flow chart illustrates an example method 200 that may be used for the partitioning and parallel processing of a virtual prototype simulation of a hardware design. The method 200, for example, may be performed by one or more of the checkpoint generation module 108, the prototype partitioning and parallel execution module 110, and the data aggregation and analysis module 112 as described in relation to FIG. 1. In some implementations, the method 200 may be performed by one or more processors of the computing device 102 and/or the processors 122.

In some implementations, the method 200 begins with receiving a request to execute a target virtual prototype simulation of a hardware design in parallel (202). The hardware design, in some examples, may be a system on chip design, integrated embedded system design, or other hardware design involving one or more subsystems that may be individually modeled in one or more virtual model representations (e.g., such as the virtual models 116 described in relation to FIG. 1). The target virtual prototype, for example, may be created as an untimed, loosely timed, or cycle accurate simulation containing one or more virtual models, each of the one or more virtual models representing a subsystem of the hardware design.

The request, in some implementations, identifies a number of execution segments for partitioning the target virtual prototype of the hardware design. In some implementations, the request identifies a desired execution time for each execution segment (e.g., every X minutes of anticipated execution time of the target virtual prototype simulation). In some implementations, the request identifies an execution time within the source virtual prototype simulation corresponding to a boundary of the next execution segment (e.g., every Y seconds of execution time of the source virtual prototype simulation). Rather than starting at the beginning of the virtual prototype simulations, in some implementations, the request includes start point information. In a first example, start point information can include instructions to begin identifying checkpoints at a point of execution (e.g., after N seconds of execution of the source virtual prototype simulation or after M cycles of execution of the source virtual prototype). In another example, start point information can include instructions to begin identifying checkpoints based upon a programmatic condition or a series of programmatic conditions (e.g., upon completion of booting the operating system). In a third example, start point information can instruct the system to begin identifying checkpoints at an identified a software or hardware breakpoint.

In some implementations, the request indicates one or, more virtual models and/or processes to analyze when identifying checkpoints. For example, checkpoints may be generated based in part upon the behavior of a particular application. The request, in some implementations, includes one or more designated cores to analyze in identifying checkpoints.

In some implementations, if the execution segments are to be overlapping for warm-up purposes, the request includes overlap criteria. For example, the request may designate that the execution segments overlap by A % or by B cycles of execution of the source virtual prototype simulation.

In some implementations, a source virtual prototype simulation representing a higher level of abstraction of the hardware design is accessed (204). In some implementations, the request identifies a source virtual prototype of the same hardware design (e.g., each containing one or more virtual models of one or more same subsystems of the hardware design). The source virtual prototype, for example, may be created as an untimed, loosely timed, or cycle accurate simulation containing one or more abstract algorithms to represent one or more virtual models, while the target virtual prototype simulation may be created as an untimed loosely timed, or cycle accurate simulation containing one or more algorithms having a greater level of detail (e.g., lower level of abstraction) to represent one or more virtual models. Due to the greater level of detail within the target virtual prototype simulation, for example, the target virtual prototype simulation may take a significant amount of time to execute in comparison to the source virtual prototype simulation.

In some implementations, a number of checkpoints is identified within the source virtual prototype simulation (206). The number of checkpoints, in some implementations, is defined by a user (e.g., within the request). In some implementations, the number of checkpoints correlates to an available number of processors. In further implementations, checkpoints may be derived every X seconds or every Y cycles of execution within the source virtual prototype simulation. For example, while executing the source virtual prototype simulation, the execution flow may be monitored, and checkpoints may be derived at identified locations within the execution flow. In some implementations, the source virtual prototype simulation is executed a first time to determine a total processing time, then a checkpoint is identified upon an even distribution (e.g., of N checkpoints) within the execution period of the source virtual prototype simulation when executed a second time. The checkpoints may be identified based upon execution time of the source virtual prototype simulation, for example, to estimate evenly portioned execution times within the target virtual prototype simulation (e.g., within a threshold of error).

In some implementations, checkpoints are identified while executing the source virtual prototype simulation serially (e.g., from beginning or from another start point to the end or another set end point as a single execution). In some implementations, checkpoints are identified while executing the source virtual prototype simulation in parallel (e.g., as two or more execution segments executed concurrently or substantially simultaneously). In one example, a first, serial, execution may establish a total processing time and a distribution of checkpoints, while checkpoint data may be collected during a second, parallel execution. In some implementations, a number of source virtual prototype models may be analyzed in parallel to identify potential checkpoints.

In some implementations, one or more portions of the source virtual prototype simulation may be marked as "exclusion zones" when identifying checkpoints. For example, certain portions of the code may be identified as lacking linearity in processing time or as being dependent upon system timing. Examples of exclusion zones include interrupt service routines, spin loops (e.g., consecutive branches to the same address or repeating branch sequences to the same address), and system timing dependent code regions.

In some implementations, the checkpoints each represent both a first breakpoint (e.g., starting point) and checkpoint data for initializing an execution segment for processing. Each of the checkpoints, in some implementations, includes checkpoint data representing a snapshot of the source virtual prototype simulation at the respective breakpoint. The snapshot, for example, may correspond to both a state representation (e.g., register contents, memory contents, etc.) and a system representation (e.g., operation branch flow, program counter, etc.). The starting point (e.g., break point) of each of the checkpoints, in some implementations, corresponds to an untimed event (e.g., within an untimed source virtual prototype simulation), such as, in some examples, a set of branches describing a program flow, a program counter value, or a detected pattern (or repetition of patterns) of a program flow. In some implementations, the starting point of each of the checkpoints corresponds to a timed event (e.g., within a cycle accurate virtual prototype simulation), such as, in some examples, a number of seconds or a number of cycles into the execution of the source virtual prototype simulation.

In some implementations, the starting point of a later checkpoint may be designed occur prior to the ending point (e.g., definition of end conditions) of a prior execution segment. For example, due to difficulties in establishing discrete start and stop times for execution segments, there may be overlap in functionality of one or more execution segments. In another example, subsequent checkpoints may be allocated in an overlapping manner such that resultant execution segments of the target virtual prototype simulation may each be allotted a "warm-up period" to allow the particular execution segment to fully initialize. For example, the hardware design may incorporate one or more prediction elements and/or other execution optimizations that may affect the behavior of the execution time and execution path (e.g., branch flow, etc.) of one or more virtual models within the target virtual prototype. In another example, a memory cache which may not be implemented in one or more virtual models 116 in a source virtual prototype 114 but is implemented in the corresponding virtual models 114 in the target virtual prototypes may alter the behavior of the execution time and/or execution path.

In some implementations, checkpoint data corresponding to a checkpoint is derived from a program execution flow log tracing a flow of operations within the source virtual prototype simulation. For example, during execution of the source virtual prototype simulation, a program execution flow log may be created. The program execution flow log, for example, may identifying events, data, and states corresponding to stages of the execution flow. The checkpoint data collected within the program execution flow log may be referred to as an execution snapshot. The snapshots, in some implementations, contain a binary state of one or more virtual models of the source virtual prototype simulation. A binary state, for example, includes a memory image of the execution state including modeling artifacts such as, for example, a cache state, a state of one or more prediction elements, and/or a state associated with one or more state-dependent execution optimizations. The binary state may only be applied when mapping to a target virtual prototype having an identical virtual model as the virtual model of the source virtual prototype in which the checkpoint was generated.

In some implementations, checkpoint data corresponding to each checkpoint is mapped to the target virtual prototype (208). Mapping the checkpoint data to the target virtual prototype, for example, may involve identifying breakpoints within the target virtual prototype corresponding to each of the checkpoints. In some implementations, the number of checkpoints corresponds to the number of checkpoints identified within the source virtual prototype during step (204). In other implementations, a subset of the identified checkpoints are applied to the target virtual prototype. For example, out of a source virtual prototype simulation including checkpoints identified every ten seconds of execution, data derived in relation to a desired number (e.g., ten, twenty, etc.) of checkpoints may be mapped to breakpoints within the target virtual prototype. The subset of checkpoints, for example, may be derived based upon an estimation of the checkpoints being positioned to evenly distribute the processing time of each execution segment of the target virtual prototype simulation. The estimated segmentation of processing time may vary within a threshold error, for example based in part upon the difference in abstraction between the source virtual prototype and the target virtual prototype. The number of checkpoints, in some implementations, may correlate to a number of available processors.

Upon identifying the breakpoints corresponding to the identified checkpoints, checkpoint data may be associated with each breakpoint to initialize the individual execution segments. For example, a portion of the program execution flow log created during execution of the source virtual prototype simulation may be assigned to each execution segment as checkpoint data (e.g., a snapshot corresponding to the begin conditions of the execution segment). The checkpoint data obtained from the execution flow log, for example, may include a system representation, a state representation, and/or a binary representation snapshot.

In some implementations, initialization data is mapped to the target virtual prototype (210). In some implementations, the target virtual prototype may require further information to enable autonomous execution. For example, if a corresponding checkpoint is created in a source virtual prototype at a higher level of abstraction than a level of abstraction of the target virtual prototype, initialization data may be included to initialize values, such as memory content and/or register values, that were not represented (or not accessible via an application programming interface (API)) during execution of the source virtual simulation. The initialization data, in some examples, may include default values (e.g., obtained through system manuals or materials known about the target virtual prototype simulation) and/or customized information (e.g., provided by the user initiating the request in step 202).

In some implementations, the autonomous execution segments are executed in parallel (212). After the target virtual prototypes have been initialized with checkpoint snapshot information and other initialization data, the execution segments are scheduled for parallel execution upon a number of processors. In some implementations, the processors are contained within two or more computing devices (e.g., servers, etc.) communicating via a network. In other implementations, the execution segments are executed upon a single multi-processor computing device. If there are fewer processing systems available than execution segments, in some implementations, a first set of execution segments may be scheduled for parallel execution, followed by one or more subsequent sets of execution segments, until all of the execution segments of the target virtual prototype simulation have been executed.

While executing, representative data is collected for each of the execution segments. The data, in some implementations, includes output, error conditions, memory states, register states, execution time, program branch flows, and other information indicative of the functionality of the target virtual prototype simulation.

In some implementations, the data includes a comparison of the functionality of the target virtual prototype simulation to the corresponding portion of the program execution flow log of the source virtual prototype simulation. During execution of a particular execution segment, in some implementations, the corresponding portion of the program execution flow log is compared to the state, events, and/or program flow of the execution segment to monitor execution. For example, to identify the end point of the execution segment, a series of events, program flow operations, and/or system states of the execution segment being executed may be compared to a final series of events, program flow operations, and/or system states as logged within the program execution flow log during execution of the source virtual prototype simulation.

In some implementations, data collected through execution of each of the execution segments is aggregated (214). Data for execution segment 0 through execution segment N, for example, may be appended in linear execution order for analysis of the functionality of the target virtual prototype simulation. In some implementations, a portion of the data collected by one or more of the execution segments is discarded. For example, due to difficulties in establishing discrete start and stop times via the checkpoints, there may be overlap in functionality of one or more pairs of the execution segments. In another example, subsequent execution segments (e.g., execution segment 2 through N) may each be allotted a "warm-up period" to allow the particular execution segment to come up to fully initialize. For example, the hardware design may incorporate one or more prediction elements and/or other execution optimizations that may affect the behavior of the execution time and execution path (e.g., branch flow, etc.) of one or more virtual models within the target virtual prototype simulation. In another example, a memory cache which may not be implemented in one or more virtual models 116 in a source virtual prototype 114 but is implemented in the corresponding virtual models 114 in the target virtual prototypes may alter the behavior of the execution time and/or execution path.

In some implementations, a simulation report including the aggregate data may be prepared (216). In some implementations, the report data includes information regarding one or more deviations between the functionality of the source virtual prototype simulation and the target virtual prototype simulation. For example, should the virtual models differ dramatically between the functionality within the source virtual prototype simulation and the target virtual prototype simulation, this may suggest that one of the virtual prototypes contains an error in either the virtual models 116 or the software running on these models.

Although the method 200 is illustrated through a particular series of example steps, in some implementations, one or more of the steps may be executed within a different order and/or one or more of the steps may be combined. For example, the checkpoints may be identified within the source virtual prototype simulation (206) prior to receiving a request to execute the target virtual prototype simulation in parallel (202). For example, a large number of checkpoints may be derived from the source virtual prototype simulation, and a portion of the checkpoints (e.g., depending upon a desired number of execution segments) may be mapped to one or more target virtual prototypes at a future time.

In some implementations, one or more steps of the method 200 may be removed. For example, rather than preparing a simulation report (216), aggregated data may be supplied to a different system for report generation. Other modifications of the method 200 are possible.

Figure 3:
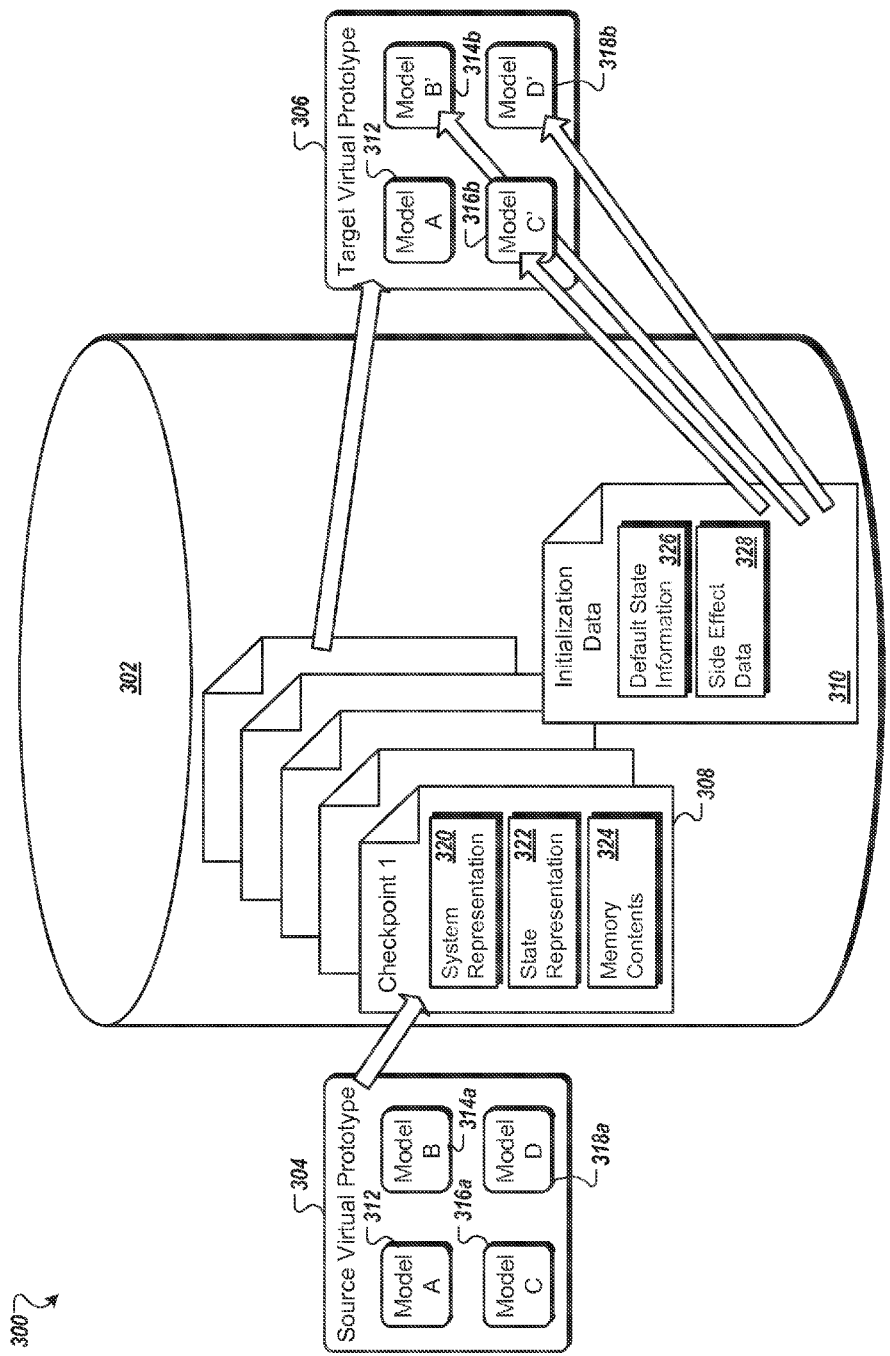
FIG. 3 is a block diagram of an example mapping of information between a source virtual prototype simulation and a target virtual prototype simulation.

FIG. 3 is a block diagram of an example system 300 for mapping information between a source virtual prototype 304 and a target virtual prototype 306. To set up two or more execution segments of a target virtual prototype simulation for autonomous execution and data reconstruction, in some implementations, the execution segments are pre-populated with information.

The information used to initialize an execution segment, in some implementations, includes checkpoint data 308. The checkpoint data 308 includes information obtained as a snapshot of the beginning point (e.g., simulation code breakpoint, etc.) marking the start of the respective execution segment. The checkpoint data 308, in some examples, may include system representation information 320, state representation information 322, and/or memory contents 324. The system representation information 320, in some examples, may include memory cache information and input/output (I/O) fetch data. In some implementations, for example if the checkpoint data 308 is being mapped from a source virtual prototype containing a same virtual model as the target virtual prototype, the system representation information 320 may include information regarding software threads, software pointers, modeling artifacts, and other binary state information regarding the virtual model. The state representation information 322, in some examples, may include software visible registers and other storage contents. Additionally, the memory contents 324 may include more long term storage information.

In some implementations, separate checkpoint data 308 is captured for two or more virtual models in the source virtual prototype. For example, the source virtual prototype 304 includes a first virtual model 312, a second virtual model 314a, a third virtual model 316a, and a fourth virtual model 318a. Each of the virtual models of the source virtual prototype 304, for example, may represent a different application, system, and/or subset of processes of the overall hardware design. The various virtual models, in some implementations, may be designed to represent the particular subset of the hardware design at varying levels of abstraction. For example, as illustrated, the second model 314a may be developed at a different (e.g., higher) level of abstraction than a second version of the second model 314b, as included within the target virtual prototype 306. Conversely, both the source virtual prototype 304 and the target virtual prototype 306 include the same first virtual model 312.

In mapping the checkpoint data 308 to the target virtual prototype 306, in some implementations, the data may be populated in part through a programming interface (API). For example, in deriving at least a portion of the checkpoint data 308, one or more state elements may be exposed through the use of one or more APIS, such as the ARM® RealView® Electronic System Level (ESL) API by ARM Holdings of Cambridge, UK, or the SystemC Configuration, Control and Inspection (CCI) API by the Accellera Systems Initiative of Napa, Calif. To map this information into the target virtual prototype 306, in some implementations, the same state elements may be accessed using the same or similar API constructs. If a binary state of a virtual model of the source virtual prototype 304 (e.g., as captured within the state representation 322) is mapped to the target virtual prototype 306 (e.g., into the first virtual model 312), in some implementations, the binary state of the virtual model is restored within the same virtual model (e.g., the first virtual model 312).

If checkpoint data 308 derived from a virtual model with a higher level of abstraction (e.g., the third virtual model 316a) is mapped to a virtual model with a lower level of abstraction (e.g., a second version of the third virtual model 316b), in some implementations, the virtual model with the lower level of abstraction may benefit from the inclusion of additional initialization data 310. The additional initialization data 310, for example, may be designed to prepare a system representation and/or state representation including various storage elements and side effect data accessed by the virtual model included in the target virtual prototype. In some implementations, the additional initialization data 310 includes default state information 326 and/or side effect data 328. The side effect data 328, for example, may include steps used to propagate data within the target virtual model which were not captured by the abstraction of the source virtual model.

Although described in relation to mapping checkpoint data from a source virtual prototype to a target virtual prototype, in some implementations, the checkpoint data may be mapped from a source virtual prototype to an RTL simulator or hardware prototype. In some implementations, mapping to an RTL simulator or hardware prototype involves populating data via an API interface, similar to the method described above in relation to the target virtual prototype 306. An API interface for mapping data values into storage elements of a register transfer level (RTL) simulator or hardware prototype, for example, may include the Verilog Programming Level Interface (PLI) (standardized as IEEE 1364), the very-high-speed integrated circuits (VHSIC) hardware description language (VHDL) foreign language interface (FLI), and the Standard Co-Emulation Modeling Interface (SCE-MI) by the Accellera Systems Initiative of Napa, Calif.

Figure 4A:
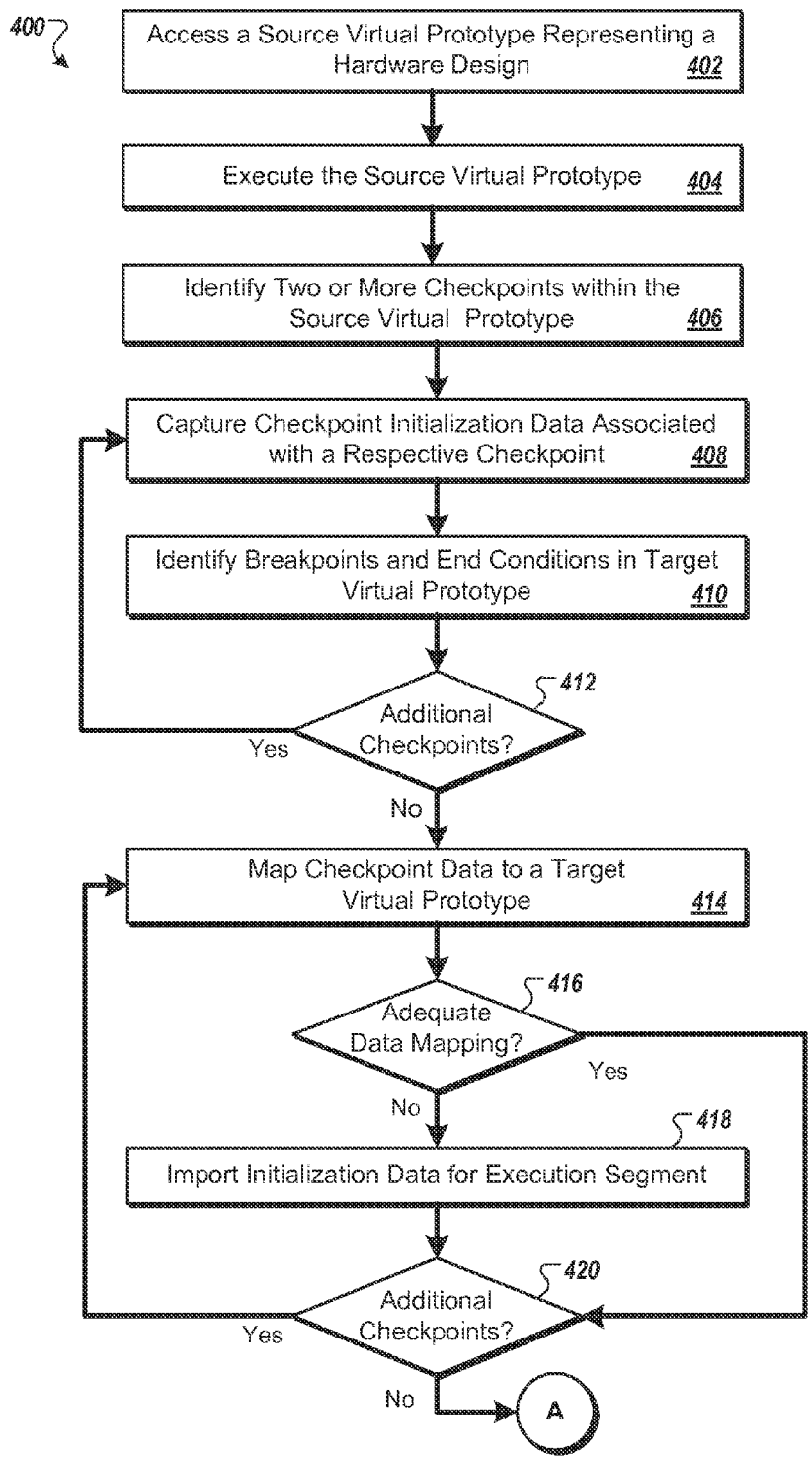
FIGS. 4A through 4C illustrate flow charts of another example method for partitioning and parallel processing of a virtual prototype simulation of a hardware design.
Figure 4B:
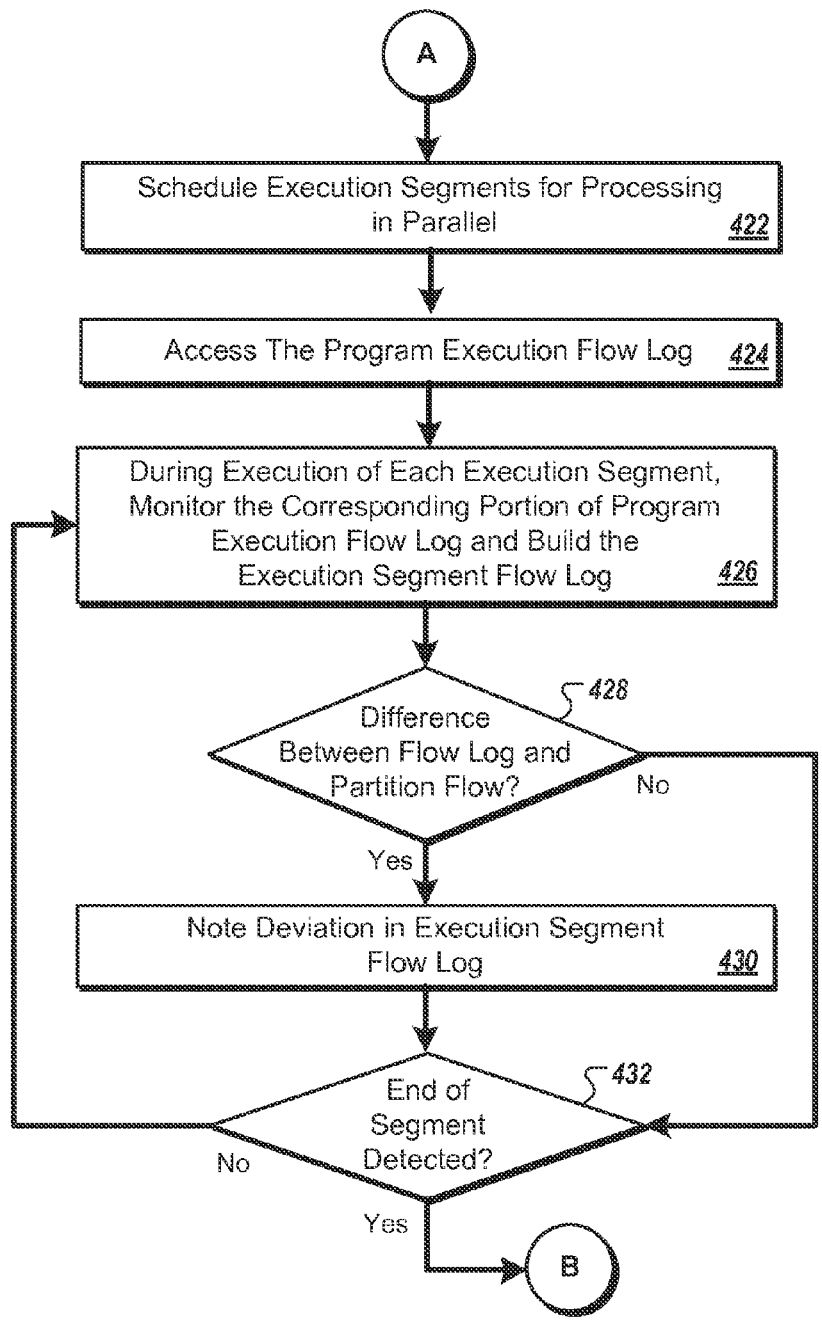
Figure 4C:
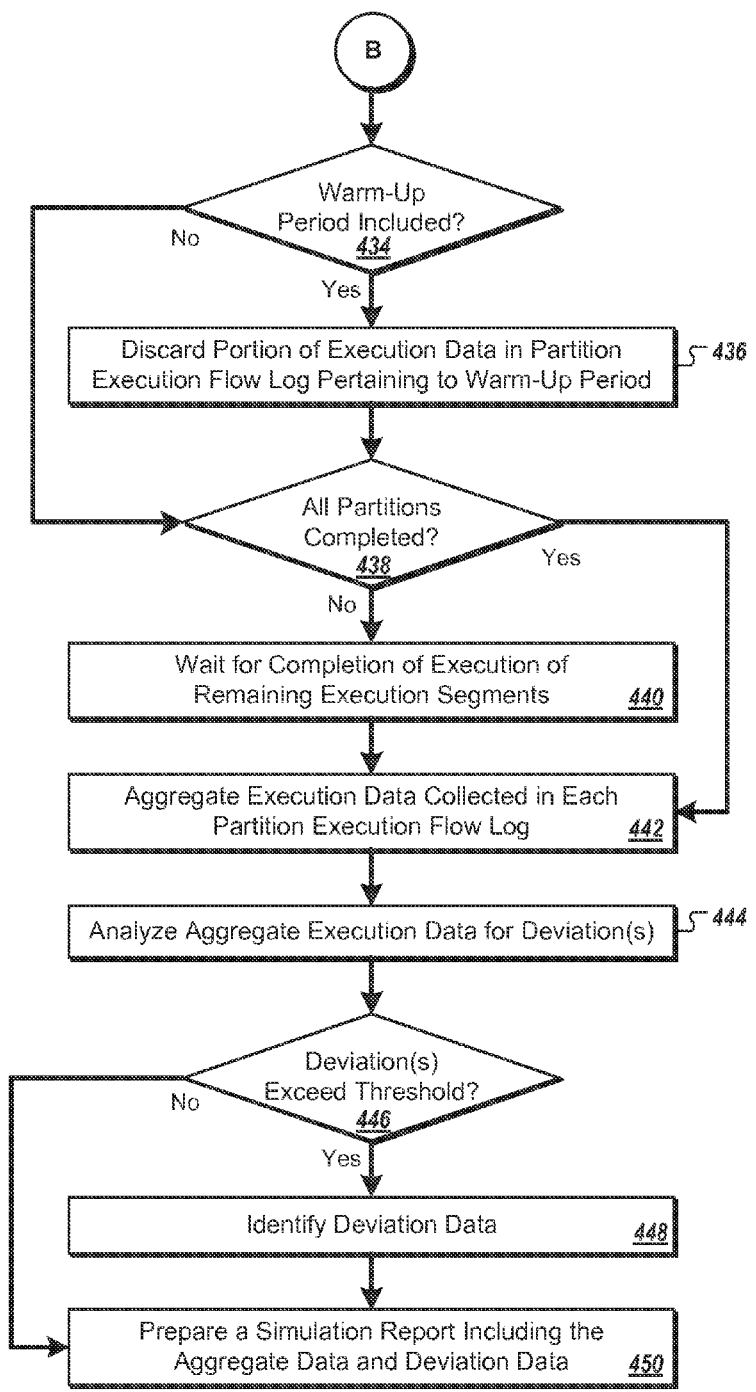

FIGS. 4A through 4C illustrate flow charts of another example method 400 for the partitioning and parallel processing of a target virtual prototype simulation of a hardware design. The method 400, for example, may be performed by one or more of the checkpoint generation module 108, the prototype partitioning and parallel execution module 110, and the data aggregation and analysis module 112 as described in relation to FIG. 1. In some implementations, the method 200 may be performed by one or more processors of the computing device 102 and/or the processors 122.

Beginning with FIG. 4A, in some implementations, the method 400 begins with accessing a source virtual prototype representing a hardware design (402). The source virtual prototype includes one or more virtual models, where each virtual model represents a software-based estimation of the functionality of a separate portion of the hardware design. The source virtual prototype, for example, may be created as an untimed, loosely timed, or cycle accurate simulation containing one or more abstract algorithms to represent the one or more virtual models.

In some implementations, the source virtual prototype simulation is executed (404). The source virtual prototype simulation may be executed, for example, to identify a total runtime length and runtime characteristics (e.g., events, program calls, branch paths, etc. occurring at points during the runtime of the source virtual prototype). The runtime characteristics, for example, may be indicative of potential breakpoint opportunities within the source virtual prototype simulation. In some implementations, a program execution flow log for the source virtual prototype is created during execution. While executing the source virtual prototype simulation, for example, one or more of the virtual models of the source virtual prototype may be traced to identify branch paths, events, program calls, and/or other information pertaining to the execution of the one or more virtual models. The monitored information is placed within the program execution flow log. Additionally, in some implementations, individual instructions may be monitored (e.g., counted, logged as pertains to particular types, etc.).

In some implementations, the logged information is organized into instruction windows, where a portion of the simulation is identified as belonging to each instruction window (e.g., simulation cycle, not linked to clock cycle).

In some implementations, two or more checkpoints are identified within the source virtual prototype (406). Based upon information identified during monitoring of the execution of the source virtual prototype simulation, for example, a checkpoint (e.g., candidate breakpoint for defining an execution segment within a target virtual prototype simulation) may be identified. In some implementations, only a portion of the source virtual prototype is considered when identifying checkpoints. For example, the potential checkpoint may include only activities occurring within one or more virtual models of the source virtual prototype, one or more processes or applications, processes accessing a particular memory location, or activities occurring with relation to a particular core. In some implementations, a portion of the source virtual prototype simulation is considered to be excluded as candidate sections for checkpoint identification. For example, certain code constructs, such as spin loops (e.g., consecutive branches to the same address or repeating branch sequences to the same address), interrupt service routines and system timing dependent code regions.

In identifying the checkpoints, in some implementations, the program execution flow log is analyzed to identify a number of instructions between checkpoints. Although the same activities may have varying timing within a target virtual prototype than in the source virtual prototype, segmentation based upon a number of instructions may, in some cases, provide a reasonable estimate of evenly distributed execution segments for execution within the target virtual prototype simulation. For a variety of reasons, however, the number of instructions executed within the source virtual prototype may not correlate to the same number of instructions (or an even distribution of execution time) within the target virtual prototype simulation. In one example, the timing of instructions as executed within the target virtual prototype simulation may vary depending up one or more of memory cache accesses, I/O fetches, and other system artifacts that can affect the relative timing of an instruction. Additionally, in some implementations, other instructions active within an instruction pipeline may constrain system resources in a way that affects the execution time of a particular instruction. In another example, different levels of abstraction may alter the behavior of timing of a particular instruction in comparison to the behavior of the actual hardware (e.g., as simulated more closely by the target virtual prototype simulation).

In some implementations, to identify candidate checkpoints, the program execution flow log is analyzed based upon time stamping of the execution of the source virtual prototype simulation. For example, based upon a total execution time, the execution flow log may be segmented into substantially even percentages of the total execution time (e.g., based upon a target total number of execution segments desired).

In some implementations, for each identified checkpoint (412), checkpoint initialization data, such as one or more of a system representation, a state representation, and memory contents associated with the respective checkpoint, are captured (408). In some implementations, the checkpoint initialization data is derived at least in part from the program execution flow log. The checkpoint initialization data, in some implementations, is captured in part during a second execution of the source virtual prototype simulation. For example, a breakpoint set at each of the checkpoints, when reached, may be used to capture a snapshot of one or more of the system representation, the state representation, and the memory contents. In some implementations, the checkpoint initialization data is captured for two or more virtual models of the source virtual simulation prototype. Checkpoint initialization data, in some implementations, may be captured in part through accessing values through one or more APIs.

In some implementations, for each identified checkpoint (412), break points and end conditions corresponding to execution segments are identified within the target virtual prototype (410). For example, the breakpoints used to obtain the checkpoint initialization data within the source virtual prototype simulation may be mapped to the same or similar construct (e.g., program call, branch path, etc.) within the target virtual prototype simulation. Breakpoints may also be obtained from events occurring within the models or between the models. For example, a bus or register having a set value or a signal such as an interrupt signal occurring. End conditions, for example, may refer to a series of events and/or behaviors indicative of an endpoint to the execution segment.

The endpoint of a particular execution segment, in some implementations, corresponds to an untimed event (e.g., within an untimed source virtual prototype simulation), such as, in some examples, a set of branches describing a program flow, a program counter value, or a detected pattern (or repetition of patterns) of a program flow. In some implementations, the endpoint of a particular execution segment corresponds to a timed event (e.g., within a cycle accurate virtual prototype simulation), such as, in some examples, a number of seconds or a number of cycles into the execution of the source virtual prototype simulation. In some implementations, the endpoint of a particular execution segment is defined by an external event such as an interrupt or system timer expiration. In some implementations, each checkpoint corresponds to a point within a program execution flow log tracing a flow of operations within the source virtual prototype simulation. The endpoint of a particular execution segment, for example, may be identified by an event or series of events captured within the program execution flow log of the source virtual prototype simulation.

The execution segments are created to contain at least the functionality of the target virtual prototype simulation from a breakpoint corresponding to a particular checkpoint to the next breakpoint (e.g., beginning point of the next checkpoint). Furthermore, in some implementations (e.g., to allow for warm-up of a particular execution segment), the second and any subsequent execution segment of the target virtual simulation prototype may include a breakpoint positioned prior to the end point of the preceding execution segment.

In some implementations, checkpoint data is mapped to breakpoints within a target virtual prototype (414). In mapping the checkpoint data to the target virtual prototype, in some implementations, the data may be populated in part through a programming interface (API). For example, in deriving at least a portion of the checkpoint data, one or more state elements may be exposed through the use of one or more APIs, such as the ARM® RealView® Electronic System Level (ESL) API by ARM Holdings of Cambridge, UK, or the SystemC Configuration, Control and Inspection (CCI) API by the Accellera Systems Initiative of Napa, Calif. To map this information into the target virtual prototype, in some implementations, the same state elements may be accessed using the same or similar API constructs. If a binary state of a virtual model of the source virtual prototype is mapped to the target virtual prototype, in some implementations, the binary state of the virtual model is restored within the same virtual model.

If the checkpoint data does not represent adequate initialization data for one or more corresponding breakpoints within the target virtual prototype (416), in some implementations, initialization data related to the respective breakpoint (e.g., start point of an execution segment) is imported (418). For example, if checkpoint data derived from a virtual model with a higher level of abstraction is mapped to a virtual model with a lower level of abstraction, in some implementations, the virtual model with the lower level of abstraction may benefit from the inclusion of additional initialization data. The additional initialization data, for example, may be designed to prepare a system representation and/or state representation including various storage elements and side effect data accessed by the virtual model included in the target virtual prototype. In some implementations, the additional initialization data includes default state information and/or side effect data. The side effect data, for example, may include steps used to propagate data within the target virtual model which were not captured by the abstraction of the source virtual model. Steps 414 through 418, in some implementations, are repeated for each additional checkpoint (420).

Turning to FIG. 4B, in some implementations, the execution segments are scheduled for processing in parallel (422).

In some implementations, the processors executing the execution segments are contained within two or more computing devices (e.g., servers, etc.) accessible to a scheduling computing device via a network. In other implementations, the execution segments are executed upon a single multi-processor computing device. If there are fewer processing systems available than execution segments, in some implementations, a first set of execution segments are initially scheduled for execution, followed by one or more subsequent sets of execution segments, until all of the execution segments have been executed.

In some implementations, the program execution flow log of the source virtual prototype simulation is accessed (424). The program execution flow log, for example, contains a trace of the performance of the functionality of one or more of the virtual models of the source virtual prototype simulation.

In some implementations, during execution of each execution segment, a corresponding portion of the program execution flow log is monitored (426). A respective execution segment flow log, in some implementations, is built at this time. For example, the portion of the program execution flow log may be compared to the execution flow of the respective execution segment to verify that the functionality is substantially identical between the two simulations.

In some implementations, if a difference is identified between the program execution flow log and the execution segment flow of an execution segment (428), a deviation is noted in the execution segment flow log (430). For example, should the program flow of the target virtual prototype simulation deviate from the program flow of the source virtual prototype simulation or cause an unexpected fault in one or more of the virtual models of the target virtual prototype simulation, this behavior is noted in the execution segment flow log.

In some implementations, one or more deviations may be expected or anticipated. For example, a processor may speculatively execute two possible paths of a branch during execution (e.g., in pipelined execution) and discard the results from the branch not taken. In this example, the processor may execute several instructions on one leg of the branch depending upon an anticipated result. A loosely timed source virtual prototype simulation would not model the pipeline behavior, speculative execution, or the memory contents established to execute these functionalities. Thus, in this circumstance, a known deviation will occur between the target virtual prototype simulation and the source virtual prototype simulation. Other known and identifiable deviations are possible.

In some implementations, steps 426 through 430 are repeated until an end of the respective execution segment is detected (432). In some implementations, the execution flow of the execution segment may be monitored for an "end sequence" identifying the end of the execution of the particular execution segment (e.g., the point at which the next execution segment begins execution). In some implementations, even within a cycle accurate virtual prototype, the cycles may not be 100% accurate. As such, it may not be possible to execute the execution segment for a set amount of time or a set number of cycles to determine the end of execution of the respective execution segment.

Turning to FIG. 4C, in some implementations, if a warm-up period has been included (434), a portion of the execution data pertaining to the warm-up period is discarded from the execution segment flow log (436). For example, information logged up to an end point of the previous execution segment may be discarded. In this manner, when compiling data collected in relation to the parallel execution of the execution segments, duplicate data will not be considered.

Alternatively, population of the execution segment flow log may not begin until an end of the warm-up period is determined to be reached. The end of warm-up period, in some implementations, may be monitored for through comparison of the execution flow of the execution segment in relation to the source program execution flow log in a similar manner as described in relation to monitoring for the end of execution of the execution segment.

In some implementations, if one or more execution segments are pending completion of execution (438) the method 400 pends completion of execution of the remaining execution segments (440).

In some implementations, execution data collected during execution of each execution segment in the respective execution segment flow log is aggregated (442). Execution data collected through execution of the execution segments, for example, may be appended in linear order for analysis of the functionality of the target virtual prototype simulation as a whole.

In some implementations, the aggregate execution data is analyzed for one or more deviations (444). For example, should the virtual models differ dramatically between the functionality within the source virtual prototype simulation and the target virtual prototype simulation, this may suggest that one of the virtual prototypes contains an error in either the virtual models 116 or the software running on these models. An error may occur, for example, due to a functional error in the source virtual prototype or the target virtual prototype, or both. In another example, the error may be due to an incorrect mapping between virtual model abstractions or missing initialization data (e.g., a lack of additional initialization data that would not have been provided by the source virtual model due to differences in abstraction levels). Furthermore, a deviation may occur due to incorrectly coded software being executed on the source virtual prototype and target virtual prototype.

In some implementations, if one or more of the identified deviations exceeds a threshold (446), deviation data is identified (448). In some implementations, an execution signature identified within the source program execution flow log may differ from an execution signature identified within the execution segment execution flow log by a threshold number of branches. For example, branch addresses AYYXXZQ may have been accessed during the source virtual prototype simulation, while branch addresses AYYXXXXXZQ were accessed during the target virtual prototype simulation.

In some implementations, the target virtual prototype simulation may fail to reach a specified branch before a timeout. For example, while monitoring for the execution signature including branch addresses AYYXXZQ, a number of N clock cycles may be allocated for reaching the completion of the execution signature. For example, if after a threshold period of time beyond the N clock cycles (e.g., 150% of the time, etc.), only the execution signature including branch addresses AYYXX has been identified, it may be derived that the system has hung during this portion of the target virtual prototype simulation.

In some implementations, an unexpected branch may be identified within an execution signature. For example, while monitoring for a sequence including branch addresses AYYXXZQ, the execution signature including branch addresses AYYXXRQ may be identified, where R is an unexpected deviation from the execution signature. In some implementations, deviations between branch addresses may be anticipated. For example, for portions of the execution flow occurring within an exclusion zone (e.g., spin loop, hardware interrupt, etc.) unexpected branch-type deviations may be ignored.

In some implementations, a branch to a known exception handler may be identified as a deviation from an anticipated execution flow. In some implementations, further analysis of the circumstances may be applied prior to identifying this behavior as a deviation.

In some implementations, a simulation report including the aggregate data is prepared (450). If deviation data was identified (446), in some implementations, the simulation report additionally includes the deviation data.

Although the method 400 is illustrated through a particular series of example steps, in some implementations, one or more of the steps may be executed within a different order and/or one or more of the steps may be combined. In some implementations, one or more steps of the method 400 may be removed. Other modifications of the method 400 are possible.

Figure 5B:
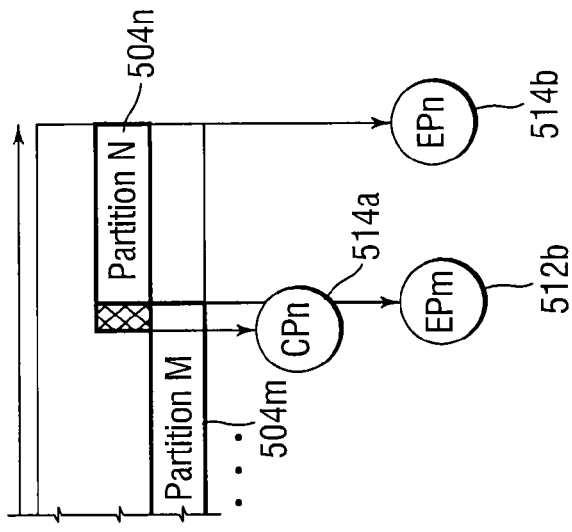
FIGS. 5A and 5B illustrate is a block diagram of an example of partitioning a source virtual prototype simulation into checkpoints defining overlapping execution segments for warm-up purpose.
Figure 5A:
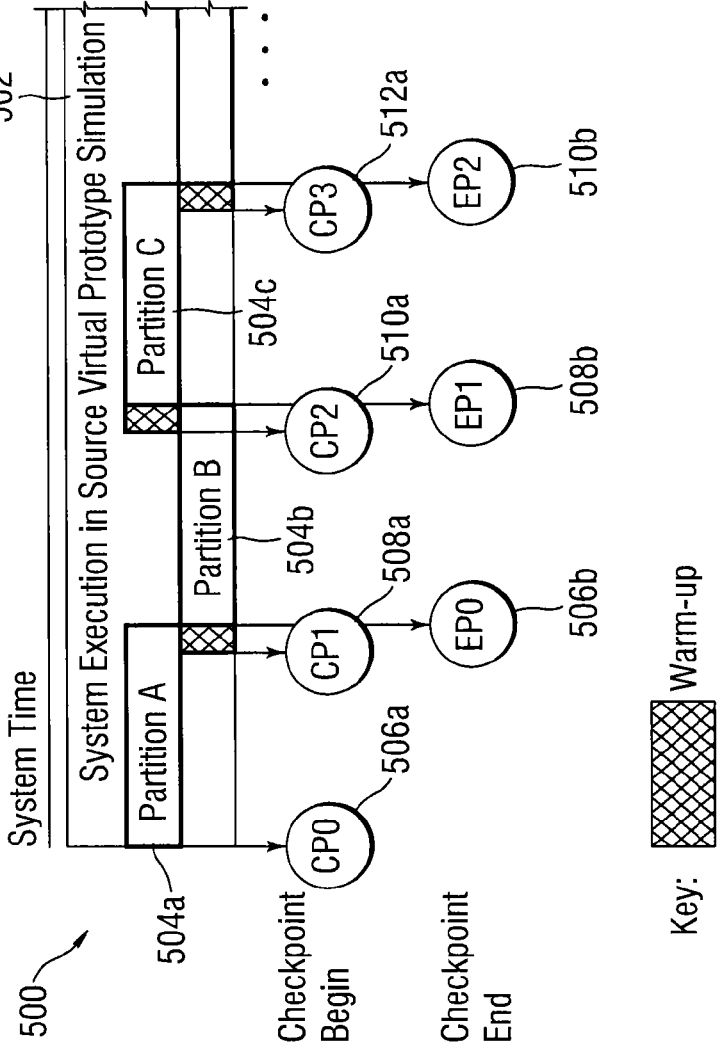

FIGS. 5A and 5B illustrate a block diagram of an example of partitioning the execution of a source virtual prototype simulation 502 into checkpoints defining overlapping execution segments 504. The overlapping execution segments 504 may be defined, for example, for warm-up purposes. When partitioning a target virtual prototype simulation into a number of execution segments 504, for example, subsequent execution segments beyond a first execution segment 504a may include overlapping functionality with the prior execution segment 504. This "warm-up period," in some implementations, is allocated to allow the particular execution segment to fully initialize. For example, the hardware design may incorporate one or more prediction elements and/or other execution optimizations that may affect the behavior of the execution time and execution path (e.g., branch flow, etc.) of one or more virtual models within the target virtual prototype. In another example, a memory cache which may not be implemented in one or more virtual models 116 in a source virtual prototype 114 but is implemented in the corresponding virtual models 114 in the target virtual prototypes (as illustrated in FIG. 1) may alter the behavior of the execution time and/or execution path.

In some implementations, checkpoints, identified by both a begin point and an end point, are generated to include a portion of overlap. For example, as illustrated within a diagram 500 of FIG. 5A, an end point 506b (e.g., "EP0") of a first checkpoint 506a (e.g., "CP0") occurs at a later time during the system execution of the source virtual prototype simulation 502 than a begin point 508a (e.g., "CP1") of the next identified checkpoint. The overlap, in some implementations, may be established based at least in part upon user preferences. In some examples, the overlap may be identified by a user as a number of execution cycles, number of instructions, or a period of time prior to the end point of a prior checkpoint. The overlap, in some implementations, may be established based at least in part upon information pertaining to the hardware design. For example, the amount of warm-up prior to coming up to full initialization may depend in part upon one or more of a size of the cache region and a complexity of the processor. In some implementations, the overlap is derived automatically or semi-automatically. For example, a warm-up period may be determined based upon information regarding the hardware design, a type of each of the virtual models within the target virtual prototype, a number of virtual models within the target virtual prototype, and/or an abstraction level of the target virtual prototype.

Figure 5C:
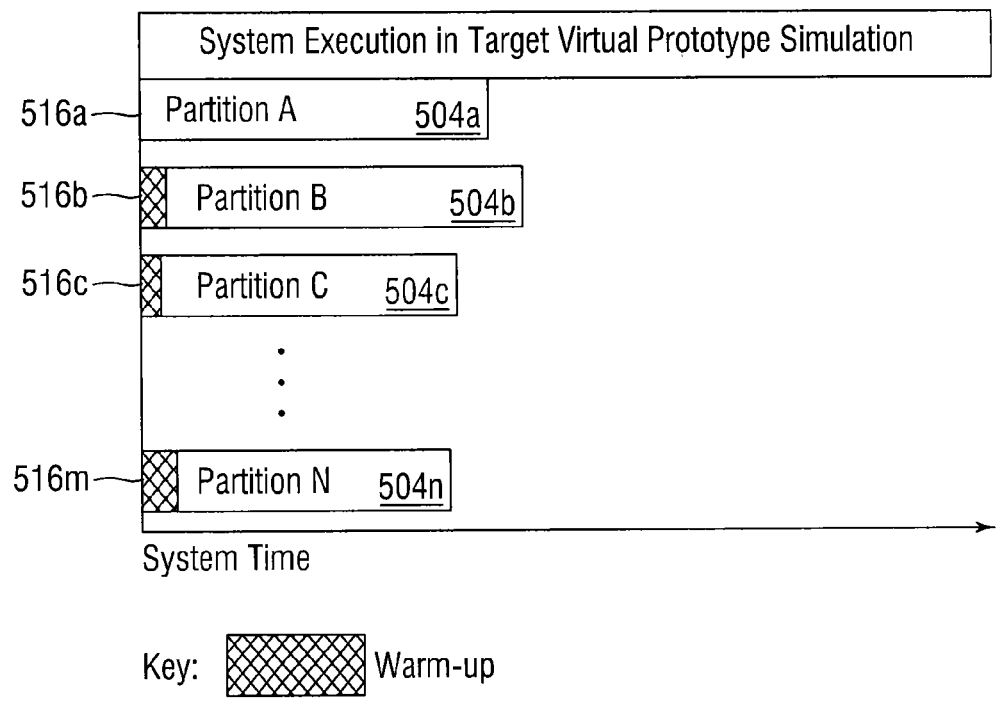
FIG. 5C illustrates a block diagram of parallel execution of an example target virtual prototype simulation using execution segments derived from the source virtual prototype simulation of FIGS. 5A and 5B.

As illustrated in FIG. 5C, during execution of the target virtual prototype simulation, each execution segment after an initial execution segment 504a (e.g., execution segments 504b through 504n) include a respective warm-up portion 516a through 516m of the autonomous execution runs of the execution segments 504. The length of execution of the warm-up portions 516a through 516m, in some implementations, may differ. Data collected during the warm-up portions 516a through 516m may be discarded to avoid overlap during analysis of the functionality of the target virtual prototype simulation.

Figure 6:
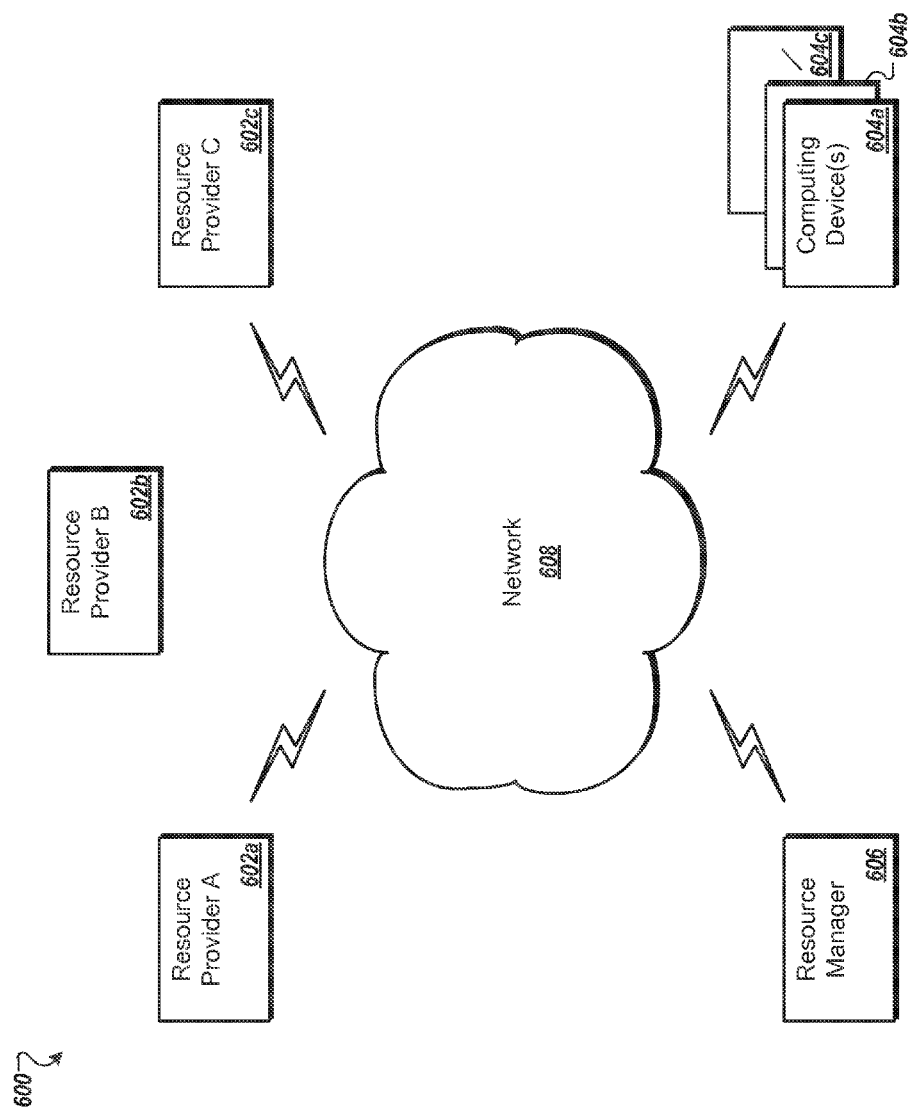
FIG. 6 is a block diagram of another example network environment for creating software applications for computing devices.

As shown in FIG. 6, an implementation of an exemplary cloud computing environment 600 for partitioning and parallel processing of a virtual prototype simulation of a hardware design is shown and described. The cloud computing environment 600 may include one or more resource providers 602a, 602b, 602c (collectively, 602). Each resource provider 602 may include computing resources. In some implementations, computing resources may include any hardware and/or software used to process data. For example, computing resources may include hardware and/or software capable of executing algorithms, computer programs, and/or computer applications. In some implementations, exemplary computing resources may include application servers and/or databases with storage and retrieval capabilities. Each resource provider 602 may be connected to any other resource provider 602 in the cloud computing environment 600. In some implementations, the resource providers 602 may be connected over a computer network 608. Each resource provider 602 may be connected to one or more computing device 604a, 604b, 604c (collectively, 604), over the computer network 608.

The cloud computing environment 600 may include a resource manager 606. The resource manager 606 may be connected to the resource providers 602 and the computing devices 604 over the computer network 608. In some implementations, the resource manager 606 may facilitate the provision of computing resources by one or more resource providers 602 to one or more computing devices 604. The resource manager 606 may receive a request for a computing resource from a particular computing device 604. The resource manager 606 may identify one or more resource providers 602 capable of providing the computing resource requested by the computing device 604. The resource manager 606 may select a resource provider 602 to provide the computing resource. The resource manager 606 may facilitate a connection between the resource provider 602 and a particular computing device 604. In some implementations, the resource manager 606 may establish a connection between a particular resource provider 602 and a particular computing device 604. In some implementations, the resource manager 606 may redirect a particular computing device 604 to a particular resource provider 602 with the requested computing resource.

Figure 7:
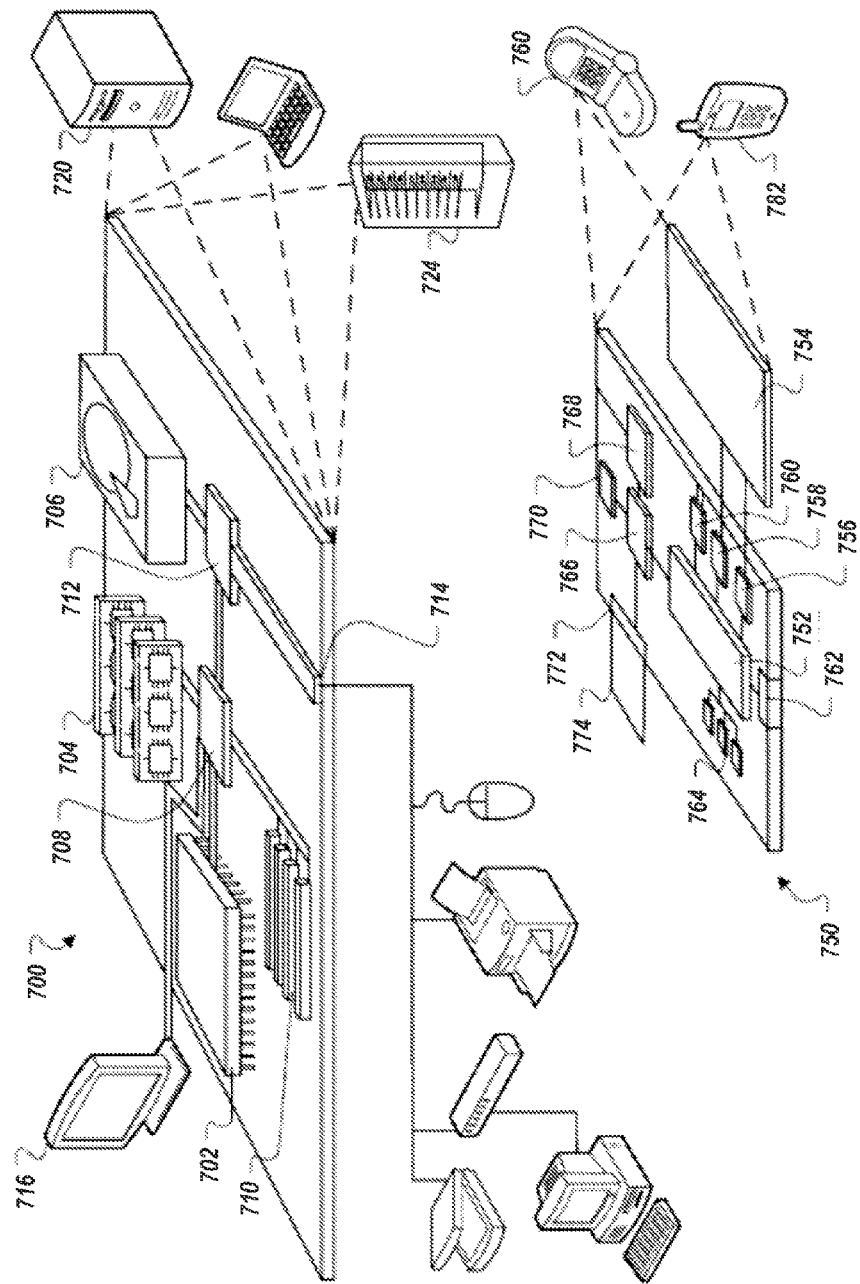
FIG. 7 is a block diagram of a computing device and a mobile computing device.

FIG. 7 shows an example of a computing device 700 and a mobile computing device 750 that can be used to implement the techniques described in this disclosure. The computing device 700 is intended to represent various forms of digital computers, such as laptops, desktops, workstations, personal digital assistants, servers, blade servers, mainframes, and other appropriate computers. The mobile computing device 750 is intended to represent various forms of mobile devices, such as personal digital assistants, cellular telephones, smartphones, and other similar computing devices. The components shown here, their connections and relationships, and their functions, are meant to be examples only, and are not meant to be limiting.

The computing device 700 includes a processor 702, a memory 704, a storage device 706, a high-speed interface 708 connecting to the memory 704 and multiple high-speed expansion ports 710, and a low-speed interface 712 connecting to a low-speed expansion port 714 and the storage device 706. Each of the processor 702, the memory 704, the storage device 706, the high-speed interface 708, the high-speed expansion ports 710, and the low-speed interface 712, are interconnected using various busses, and may be mounted on a common motherboard or in other manners as appropriate. The processor 702 can process instructions for execution within the computing device 700, including instructions stored in the memory 704 or on the storage device 706 to display graphical information for a GUI on an external input/output device, such as a display 716 coupled to the high-speed interface 708. In other implementations, multiple processors and/or multiple buses may be used, as appropriate, along with multiple memories and types of memory. Also, multiple computing devices may be connected, with each device providing portions of the necessary operations (e.g., as a server bank, a group of blade servers, or a multi-processor system).

The memory 704 stores information within the computing device 700. In some implementations, the memory 704 is a volatile memory unit or units. In some implementations, the memory 704 is a non-volatile memory unit or units. The memory 704 may also be another form of computer-readable medium, such as a magnetic or optical disk.

The storage device 706 is capable of providing mass storage for the computing device 700. In some implementations, the storage device 706 may be or contain a computer-readable medium, such as a floppy disk device, a hard disk device, an optical disk device, or a tape device, a flash memory or other similar solid state memory device, or an array of devices, including devices in a storage area network or other configurations. Instructions can be stored in an information carrier. The instructions, when executed by one or more processing devices (for example, processor 702), perform one or more methods, such as those described above. The instructions can also be stored by one or more storage devices such as computer- or machine-readable mediums (for example, the memory 704, the storage device 706, or memory on the processor 702).

The high-speed interface 708 manages bandwidth-intensive operations for the computing device 700, while the low-speed interface 712 manages lower bandwidth-intensive operations. Such allocation of functions is an example only. In some implementations, the high-speed interface 708 is coupled to the memory 704, the display 716 (e.g., through a graphics processor or accelerator), and to the high-speed expansion ports 710, which may accept various expansion cards (not shown). In the implementation, the low-speed interface 712 is coupled to the storage device 706 and the low-speed expansion port 714. The low-speed expansion port 714, which may include various communication ports (e.g., USB, Bluetooth®, Ethernet, wireless Ethernet) may be coupled to one or more input/output devices, such as a keyboard, a pointing device, a scanner, or a networking device such as a switch or router, e.g., through a network adapter.

The computing device 700 may be implemented in a number of different forms, as shown in the figure. For example, it may be implemented as a standard server 720, or multiple times in a group of such servers. In addition, it may be implemented in a personal computer such as a laptop computer 722. It may also be implemented as part of a rack server system 724. Alternatively, components from the computing device 700 may be combined with other components in a mobile device (not shown), such as a mobile computing device 750. Each of such devices may contain one or more of the computing device 700 and the mobile computing device 750, and an entire system may be made up of multiple computing devices communicating with each other.

The mobile computing device 750 includes a processor 752, a memory 764, an input/output device such as a display 754, a communication interface 766, and a transceiver 768, among other components. The mobile computing device 750 may also be provided with a storage device, such as a microdrive or other device, to provide additional storage. Each of the processor 752, the memory 764, the display 754, the communication interface 766, and the transceiver 768, are interconnected using various buses, and several of the components may be mounted on a common motherboard or in other manners as appropriate.

The processor 752 can execute instructions within the mobile computing device 750, including instructions stored in the memory 764. The processor 752 may be implemented as a chipset of chips that include separate and multiple analog and digital processors. The processor 752 may provide, for example, for coordination of the other components of the mobile computing device 750, such as control of user interfaces, applications run by the mobile computing device 750, and wireless communication by the mobile computing device 750.

The processor 752 may communicate with a user through a control interface 758 and a display interface 756 coupled to the display 754. The display 754 may be, for example, a TFT (Thin-Film-Transistor Liquid Crystal Display) display or an OLED (Organic Light Emitting Diode) display, or other appropriate display technology. The display interface 756 may comprise appropriate circuitry for driving the display 754 to present graphical and other information to a user. The control interface 758 may receive commands from a user and convert them for submission to the processor 752. In addition, an external interface 762 may provide communication with the processor 752, so as to enable near area communication of the mobile computing device 750 with other devices. The external interface 762 may provide, for example, for wired communication in some implementations, or for wireless communication in other implementations, and multiple interfaces may also be used.

The memory 764 stores information within the mobile computing device 750. The memory 764 can be implemented as one or more of a computer-readable medium or media, a volatile memory unit or units, or a non-volatile memory unit or units. An expansion memory 774 may also be provided and connected to the mobile computing device 750 through an expansion interface 772, which may include, for example, a SIMM (Single In Line Memory Module) card interface. The expansion memory 774 may provide extra storage space for the mobile computing device 750, or may also store applications or other information for the mobile computing device 750. Specifically, the expansion memory 774 may include instructions to carry out or supplement the processes described above, and may include secure information also. Thus, for example, the expansion memory 774 may be provide as a security module for the mobile computing device 750, and may be programmed with instructions that permit secure use of the mobile computing device 750. In addition, secure applications may be provided via the SIMM cards, along with additional information, such as placing identifying information on the SIMM card in a non-hackable manner.

The memory may include, for example, flash memory and/or NVRAM memory (non-volatile random access memory), as discussed below. In some implementations, instructions are stored in an information carrier. that the instructions, when executed by one or more processing devices (for example, processor 752), perform one or more methods, such as those described above. The instructions can also be stored by one or more storage devices, such as one or more computer- or machine-readable mediums (for example, the memory 764, the expansion memory 774, or memory on the processor 752). In some implementations, the instructions can be received in a propagated signal, for example, over the transceiver 768 or the external interface 762.

The mobile computing device 750 may communicate wirelessly through the communication interface 766, which may include digital signal processing circuitry where necessary. The communication interface 766 may provide for communications under various modes or protocols, such as GSM voice calls (Global System for Mobile communications), SMS (Short Message Service), EMS (Enhanced Messaging Service), or MMS messaging (Multimedia Messaging Service), CDMA (code division multiple access), TDMA (time division multiple access), PDC (Personal Digital Cellular), WCDMA (Wideband Code Division Multiple Access), CDMA2000, or GPRS (General Packet Radio Service), among others. Such communication may occur, for example, through the transceiver 768 using a radio-frequency. In addition, short-range communication may occur, such as using a Bluetooth®, Wi-Fi™, or other such transceiver (not shown). In addition, a GPS (Global Positioning System) receiver module 770 may provide additional navigation- and location-related wireless data to the mobile computing device 750, which may be used as appropriate by applications running on the mobile computing device 750.

The mobile computing device 750 may also communicate audibly using an audio codec 760, which may receive spoken information from a user and convert it to usable digital information. The audio codec 760 may likewise generate audible sound for a user, such as through a speaker, e.g., in a handset of the mobile computing device 750. Such sound may include sound from voice telephone calls, may include recorded sound (e.g., voice messages, music files, etc.) and may also include sound generated by applications operating on the mobile computing device 750.

The mobile computing device 750 may be implemented in a number of different forms, as shown in the figure. For example, it may be implemented as a cellular telephone 780. It may also be implemented as part of a smart-phone 782, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms machine-readable medium and computer-readable medium refer to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term machine-readable signal refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network (LAN), a wide area network (WAN), and the Internet.

The computing system can include clients and servers. A client and server are generally remote from each other and typically interact through a communication network. The relationship of client and server arises by virtue of computer programs running on the respective computers and having a client-server relationship to each other.

In view of the structure, functions and apparatus of the systems and methods described here, in some implementations, environments and methods for partitioning and parallel processing of a virtual prototype simulation of a hardware design are provided. Having described certain implementations of methods and apparatus for supporting the partitioning and parallel processing of a virtual prototype simulation of a hardware design, it will now become apparent to one of skill in the art that other implementations incorporating the concepts of the disclosure may be used. Therefore, the disclosure should not be limited to certain implementations, but rather should be limited only by the spirit and scope of the following claims.

What is claimed:

1. A method comprising:
   accessing a first virtual prototype comprising one or more virtual models, wherein
      the first virtual prototype is configured, upon execution, to perform a first simulation of at least a portion of a hardware design;
   identifying, by a processor of a computing device, a plurality of checkpoints within the first virtual prototype, wherein
      each checkpoint of the plurality of checkpoints comprises at least one of a storage state and a behavioral state;
   determining, by the processor, a plurality of breakpoints for dividing execution of a second virtual prototype into a series of autonomous execution segments, wherein
      the second virtual prototype is configured, upon execution, to perform a second simulation of the portion of the hardware design, the second virtual prototype comprises one or more virtual models, wherein
each virtual model of the second virtual prototype represents a separate portion of the hardware design, and
each respective virtual model of the second virtual prototype represents
a same portion of the hardware design as a corresponding virtual model of the first virtual prototype, and
the plurality of breakpoints correspond to the plurality of checkpoints;
for each checkpoint of the plurality of checkpoints, mapping, by the processor, the at least one of the storage state and the behavioral state of the respective checkpoint to a respective execution segment comprising a respective breakpoint of the plurality of breakpoints;
causing, by the processor, execution of the second simulation, wherein
executing the second simulation comprises executing each execution segment of the series of autonomous execution segments, wherein
two or more execution segments of the series of autonomous execution segments are executed concurrently, and
respective data is collected during execution of each execution segment of the series of autonomous execution segments; and
aggregating, by the processor, the respective data as aggregated data.

2. The method of claim 1, wherein identifying the plurality of checkpoints comprises estimating execution time of each execution segment of the series of execution segments within a threshold variance.

3. The method of claim 1, wherein the hardware design comprises an integrated embedded system design.

4. The method of claim 3, wherein the hardware design comprises a system on a chip (SoC) design.

5. The method of claim 1, wherein the second virtual prototype is a real time simulation.

6. The method of claim 1, wherein the first virtual prototype is a loosely-timed prototype or an approximately-timed prototype.

7. The method of claim 1, wherein the second virtual prototype is a cycle accurate prototype.

8. The method of claim 1, wherein each checkpoint of the plurality of checkpoints is represented in at least one of a simulated timeframe and an event-driven timeframe.

9. The method of claim 1, further comprising generating report data based in part upon the aggregated data.

10. The method of claim 9, wherein the report data is further based upon data collected through execution of the first simulation.

11. The method of claim 10, wherein:
identifying the plurality of checkpoints comprises executing the first simulation; and
the data collected through execution of the first simulation comprises the at least one of the storage state and the behavioral state.

12. The method of claim 10, further comprising validating at least one of the first virtual prototype and the second virtual prototype, wherein validating comprises analyzing the aggregated data in light of the data collected through execution of the first simulation.

13. The method of claim 1, wherein the first virtual prototype comprises two or more software processes, and identifying the plurality of checkpoints comprises identifying the plurality of checkpoints within a subset of the two or more software processes.

14. The method of claim 1, further comprising, prior to executing each execution segment of the series of autonomous execution segments, importing initialization data into each execution segment of the series of execution segments.

15. The method of claim 1, wherein identifying the plurality of checkpoints comprises:
recognizing one or more exclusion zones within a code base of the first virtual prototype; and
marking the one or more exclusion zones as ineligible for checkpoint identification.

16. The method of claim 15, wherein each exclusion zone of the one or more exclusion zones comprises a software routine that executes at one of a) varying frequency and b) varying length of time depending upon a level of abstraction of simulation prototype.

17. The method of claim 15, wherein a first exclusion zone of the one or more exclusion zones comprises an interrupt service routine.

18. The method of claim 1, further comprising, prior to identifying the plurality of checkpoints, executing the first simulation to determine a total length of simulation.

19. The method of claim 18, wherein identifying the plurality of checkpoints comprises executing the first simulation while tracking at least one of a program counter and a series of program branches.

20. The method of claim 19, further comprising, while executing the first simulation, creating a program execution flow log of the first simulation.

21. The method of claim 20, wherein executing the series of autonomous execution segments comprises, for each execution segment of the series of autonomous execution segments:
tracking a program execution flow; and
comparing the program execution flow to a portion of the program execution flow log of the first simulation, wherein the portion of the program execution flow log maps to the respective execution segment.

22. The method of claim 21, wherein tracking the program execution flow comprises tracking the program execution flow using the program counter.

23. The method of claim 21, wherein tracking the program execution flow comprises tracking the program branches.

24. The method of claim 21, further comprising, while comparing the program execution flow to the portion of the program execution flow log of the first simulation, identifying a deviation between the program execution flow and the portion of the program execution flow log.

25. A system comprising:
a processor; and
a memory having instructions stored thereon, wherein the instructions, when executed by the processor, cause the processor to:
access a first virtual prototype comprising one or more virtual models, wherein
the first virtual prototype is configured, upon execution, to perform a first simulation of at least a portion of a hardware design;
identify a plurality of checkpoints within the first virtual prototype, wherein each checkpoint of the plurality of checkpoints comprises at least one of a storage state and a behavioral state;
determine a plurality of breakpoints for dividing execution of a second virtual prototype into a series of autonomous execution segments, wherein the second virtual prototype is configured, upon execution, to perform a second simulation of the portion of the hardware design,
the second virtual prototype comprises one or more virtual models, wherein
each virtual model of the second virtual prototype represents a separate portion of the hardware design, and
each respective virtual model of the second virtual prototype represents a same portion of the hardware design as a corresponding virtual model of the first virtual prototype, and
the plurality of breakpoints correspond to the plurality of checkpoints;
for each checkpoint of the plurality of checkpoints, map the at least one of the storage state and the behavioral state of the respective checkpoint to a respective execution segment comprising a respective breakpoint of the plurality of breakpoints;
cause execution of the second simulation, wherein
executing the second simulation comprises executing each execution segment of the series of autonomous execution segments, wherein
two or more execution segments of the series of autonomous execution segments are executed concurrently, and
respective data is collected during execution of each execution segment of the series of autonomous execution segments; and
aggregate the respective data as aggregated data.

26. The system of claim 25, wherein the instructions, when executed, further cause the processor to, for each execution segment of the series of autonomous execution segments, determine one or more end conditions.

27. The system of claim 26, wherein the one or more end conditions comprises one of a timed event and an untimed event within the execution of the second simulation.

28. The system of claim 26, wherein identifying the plurality of checkpoints comprises building a warm-up period into each execution segment of the series of autonomous execution segments following a first execution segment of the series of autonomous execution segments, wherein building the warm-up period into a given execution segment comprises determining the one or more end conditions to identify a point in execution after a respective breakpoint representing a begin point of a next execution segment.

29. The system of claim 28, wherein aggregating the respective data comprises discarding a portion of the respective data corresponding to a respective warm-up period.

30. A non-transitory computer readable medium having instructions stored thereon, wherein the instructions, when executed by a processor, cause the processor to:
access a first virtual prototype comprising one or more virtual models, wherein
the first virtual prototype is configured, upon execution, to perform a first simulation of at least a portion of a hardware design;
identify a plurality of checkpoints within the first virtual prototype, wherein
each checkpoint of the plurality of checkpoints comprises at least one of a storage state and a behavioral state;
determine a plurality of breakpoints for dividing execution of a second virtual prototype into a series of autonomous execution segments, wherein
the second virtual prototype is configured, upon execution, to perform a second simulation of the portion of the hardware design,
the second virtual prototype comprises one or more virtual models, wherein
each virtual model of the second virtual prototype represents a separate portion of the hardware design, and
each respective virtual model of the second virtual prototype represents a same portion of the hardware design as a corresponding virtual model of the first virtual prototype, and
the plurality of breakpoints correspond to the plurality of checkpoints;
for each checkpoint of the plurality of checkpoints, map the at least one of the storage state and the behavioral state of the respective checkpoint to a respective execution segment comprising a respective breakpoint of the plurality of breakpoints;
cause execution of the second simulation, wherein
executing the second simulation comprises executing each execution segment of the series of autonomous execution segments, wherein
two or more execution segments of the series of autonomous execution segments are executed concurrently, and
respective data is collected during execution of each execution segment of the series of autonomous execution segments; and
aggregate the respective data as aggregated data.

* * * * *